(12) United States Patent
Wang et al.

(10) Patent No.: US 12,283,553 B2
(45) Date of Patent: *Apr. 22, 2025

(54) SEMICONDUCTOR DIE WITH WARPAGE RELEASE LAYER STRUCTURE IN PACKAGE AND FABRICATING METHOD THEREOF

(71) Applicant: Taiwan Semiconductor Manufacturing Company, Ltd., Hsinchu (TW)

(72) Inventors: Chin-Hua Wang, New Taipei (TW); Kuang-Chun Lee, New Taipei (TW); Shu-Shen Yeh, Taoyuan (TW); Tsung-Yen Lee, Changhua County (TW); Po-Yao Lin, Hsinchu County (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/311,434

(22) Filed: May 3, 2023

(65) Prior Publication Data

US 2023/0275038 A1    Aug. 31, 2023

Related U.S. Application Data

(63) Continuation of application No. 17/370,299, filed on Jul. 8, 2021, now Pat. No. 11,694,974.

(51) Int. Cl.
    *H01L 23/00*    (2006.01)
    *H01L 21/56*    (2006.01)
    (Continued)

(52) U.S. Cl.
    CPC .......... *H01L 23/562* (2013.01); *H01L 21/563* (2013.01); *H01L 23/3128* (2013.01);
    (Continued)

(58) Field of Classification Search
    CPC . H01L 23/562; H01L 21/563; H01L 23/3128; H01L 25/18; H01L 25/50
    See application file for complete search history.

(56) References Cited

U.S. PATENT DOCUMENTS 10,475,752 B2    11/2019  Hsu et al.
11,133,269 B2     9/2021  Lu et al.
                 (Continued)

FOREIGN PATENT DOCUMENTS

CN    103383927 A    11/2013
CN    110880457 A     3/2020
                 (Continued)

OTHER PUBLICATIONS

Chinese language Notice of Allowance mailed Mar. 28, 2023, issued in application No. TW 111112965.

*Primary Examiner* — Thao P Le
(74) *Attorney, Agent, or Firm* — McClure, Qualey & Rodack, LLP

(57) ABSTRACT

A chip package structure is provided. The chip package structure includes a first semiconductor die bonded over an interposer substrate and a warpage release layer structure. The chip package structure also includes a first organic material layer covering an upper surface of the first semiconductor die; and a first metal layer covering an upper surface of the first organic material layer. The first metal layer has a planar shape that is the same as a planar shape of the first semiconductor die, as viewed in a top-view perspective.

20 Claims, 26 Drawing Sheets

(51) Int. Cl.
  *H01L 23/31* (2006.01)
  *H01L 23/373* (2006.01)
  *H01L 25/00* (2006.01)
  *H01L 25/065* (2023.01)
  *H01L 25/18* (2023.01)

(52) U.S. Cl.
  CPC ...... *H01L 23/3736* (2013.01); *H01L 25/0655* (2013.01); *H01L 25/18* (2013.01); *H01L 25/50* (2013.01)

(56) References Cited

U.S. PATENT DOCUMENTS

| | | | |
|---|---|---|---|
| 11,694,974 B2 * | 7/2023 | Wang | H01L 25/0655 257/668 |
| 12,009,317 B2 * | 6/2024 | Yen | H01L 23/4334 |
| 2007/0108572 A1 | 5/2007 | Hsu | |
| 2007/0246821 A1 | 10/2007 | Lu | |
| 2013/0249075 A1 | 9/2013 | Tateiwa et al. | |
| 2019/0139896 A1 | 5/2019 | Hsu et al. | |
| 2019/0148351 A1 | 5/2019 | Chen | |
| 2021/0202463 A1 | 7/2021 | Chen | |
| 2022/0045016 A1 | 2/2022 | Jeng | |
| 2022/0102234 A1 | 3/2022 | Das Mahapatra | |
| 2022/0262768 A1 | 8/2022 | Chen | |
| 2023/0078099 A1 * | 3/2023 | Ecton | H01L 21/486 257/773 |
| 2024/0107784 A1 * | 3/2024 | Kaviani | H10K 30/88 |
| 2024/0136275 A1 * | 4/2024 | Chen | H01L 24/08 |
| 2024/0162157 A1 * | 5/2024 | Ecton | H01L 23/49827 |
| 2024/0178095 A1 * | 5/2024 | Hung | H01L 24/32 |
| 2024/0186252 A1 * | 6/2024 | Lin | H01L 21/4857 |
| 2024/0186270 A1 * | 6/2024 | Pietambaram | H01L 23/49838 |

FOREIGN PATENT DOCUMENTS

| | | |
|---|---|---|
| EP | 1 028 463 A1 | 8/2000 |
| TW | I618206 B | 3/2018 |
| TW | 202117945 A | 5/2021 |
| WO | 2020/176559 A1 | 9/2020 |

\* cited by examiner

SEMICONDUCTOR DIE WITH WARPAGE RELEASE LAYER STRUCTURE IN PACKAGE AND FABRICATING METHOD THEREOF

PRIORITY CLAIM AND CROSS-REFERENCE

This Application is a Continuation of U.S. patent application Ser. No. 17/370,299, filed Jul. 8, 2021, now U.S. Pat. No. 11,694,974, the entirety of which is incorporated by reference herein.

BACKGROUND

Semiconductor devices and integrated circuits are typically manufactured on a single semiconductor wafer. The semiconductor dies of the wafer may be processed and packaged with other semiconductor devices or dies at the wafer level, and various technologies have been developed for the wafer level packaging.

In the packaging of integrated circuits, semiconductor dies may be stacked and bonded to other package components (e.g., interposer substrates and package substrates). However, since feature sizes of semiconductor dies continue to decrease, feature sizes of package components (e.g., interposer substrates) for carrying the semiconductor dies decrease as well. Therefore, it is a challenge to form reliable chip packages.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1H-1 is a cross-sectional view of a chip package structure, in accordance with some embodiments.

FIG. 1H-2 is a cross-sectional view of a chip package structure, in accordance with some embodiments.

FIG. 2E-1 is a cross-sectional view of a chip package structure, in accordance with some embodiments.

FIG. 2E-2 is a cross-sectional view of a chip package structure, in accordance with some embodiments.

FIG. 3E-1 is a cross-sectional view of a chip package structure, in accordance with some embodiments.

FIG. 3E-2 is a cross-sectional view of a chip package structure, in accordance with some embodiments.

DETAILED DESCRIPTION

Figure 1A:
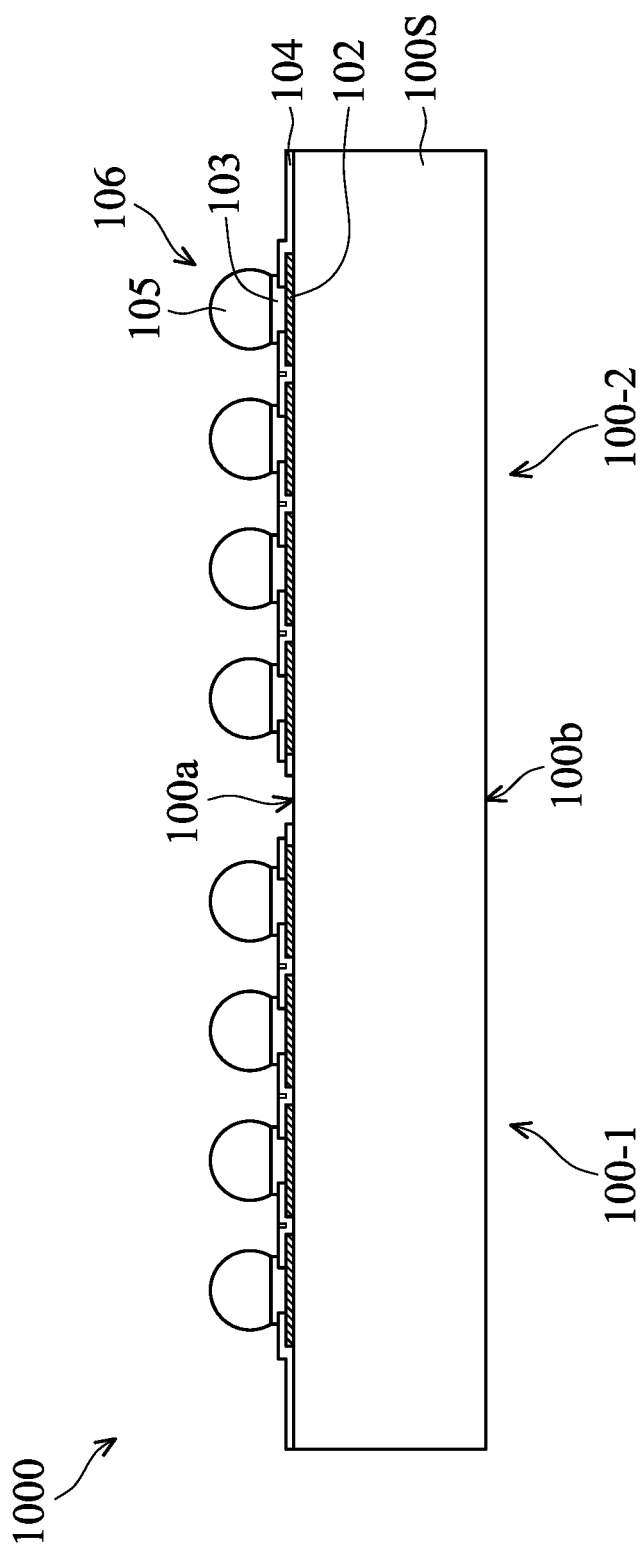
FIGS. 1A-1H are cross-sectional views of various stages of a method for forming a chip package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x ±5 or 10%.

Some embodiments of the disclosure are described. FIGS. 1A to 1H are cross-sectional views of various stages of a process for forming a chip package structure 10, in accordance with some embodiments. Additional operations can be provided before, during, and/or after the stages described in FIGS. 1A to 1H. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As shown in FIG. 1A, a semiconductor wafer 1000 is provided. The semiconductor wafer 1000 includes semiconductor chips (which are also referred to as semiconductor dies when sawed apart). In order to simplify the diagram, only two adjacent semiconductor chips/dies 100-1 and 100-2 are depicted. In some embodiments, the semiconductor chip/die 100-1 or 100-2 provides logic functions for the structures. For example, each of the semiconductor chips/dies 100-1 and 100-2 is a logic die (e.g., a central processing unit (CPU) die, a graphic processing unit (GPU) die, a mobile application die, a micro control unit (MCU) die, an application processor (AP) die), or a memory die (e.g., a high bandwidth memory (HBM) die or a static random access memory (SRAM) die), although any suitable semiconductor chip/die may be utilized. In some other embodiment, each of the semiconductor chips/dies 100-1 and 100-2 is a system-on-chip (SoC) die (which includes multiple functions).

The semiconductor wafer 1000 (and semiconductor dies 100-1 and 100-2 therein) may include a semiconductor substrate 100S. The semiconductor substrate 100S may include bulk silicon, doped or undoped, or an active layer of a silicon-on-insulator (SOI) substrate. Generally, an SOI substrate includes a layer of a semiconductor material such as silicon, germanium, silicon germanium, or combinations thereof. The semiconductor substrate 100S may include integrated circuit devices (not shown) and an interconnect structure (not shown). The integrated circuit devices may include active devices (e.g., transistors). The active devices may be formed using any suitable methods either within or else on the semiconductor substrate 100S. In some embodiments, the interconnect structure is formed over the semiconductor substrate 100S and the active devices and are designed to connect the various active devices to form functional circuitry. In some embodiments, the interconnect structure is formed of alternating layers of dielectric and conductive material and may be formed through any suitable process (such as deposition, damascene, dual damascene, etc.). The dielectric layers may include low-k dielectric layers, for example, with k values lower than about 3.0.

In some embodiments, conductive pads 102 are formed at the front surface 100a (which is also referred to as an active surface) of the semiconductor substrate 100S, and are electrically coupled to integrated circuit devices (not shown) through the interconnect structure (not shown). In some embodiments, the conductive pads 102 are bonding pads. The conductive pads 102 may be made of metals such as aluminum, copper, nickel, gold, and combinations thereof. The conductive pads 102 may be formed using a deposition process, such as sputtering, to form a layer of material and the layer of material may then be patterned via a suitable process (such as lithography and etching) to form the contact pads.

In some embodiments, conductive pillars 103, such as copper pillars, copper alloy pillars, or other suitable metal pillars, are formed on conductive pads 102. The conductive pillars 103 are formed on conductive pads 102. For example, the conductive pillars 103 may be formed by initially placing a photoresist and then patterning the photoresist into the desired pattern for the conductive pillars. A plating process is then utilized to form the conductive material (e.g., copper) in connection with the conductive pads 102. However, any suitable methods may be utilized.

In some embodiments, a passivation layer 104 is formed to cover the active surface 100a of the semiconductor substrate 100S and a portion of the conductive pad 102. The material of passivation layer 104 may be selected from solder resists, a polymer such as polyimide (PI), polybenzoxazole (PBO), benzocyclobutene (BCB), molding compound, and the like. Alternatively, the material of passivation layer 104 may be selected from silicon oxide, silicon oxynitride, silicon nitride, silicon carbide, another suitable material, or a combination thereof.

In some embodiments, the conductive pillars 103 protrude out of the passivation layer 104. In some other embodiments, the conductive pillars 103 are embedded in the passivation layer 104.

In some embodiments, after the conductive pillars 103 are formed, electrical connectors 105 (e.g., microbumps) are correspondingly bonded on the conductive pillars 103 of the semiconductor wafer 1000. For example, the electrical connectors 105 may be solder balls and formed on the conductive pillars 103 using a ball-mounting head (not shown). The electrical connectors 105 may be made of a material such as tin, silver, lead-free tin, or copper. The conductive pillar 103 and the overlying electrical connector 105 form a bump structure 106 that serves as an electrical connection between the semiconductor die 100 and an external circuit (not shown).

Figure 1B:
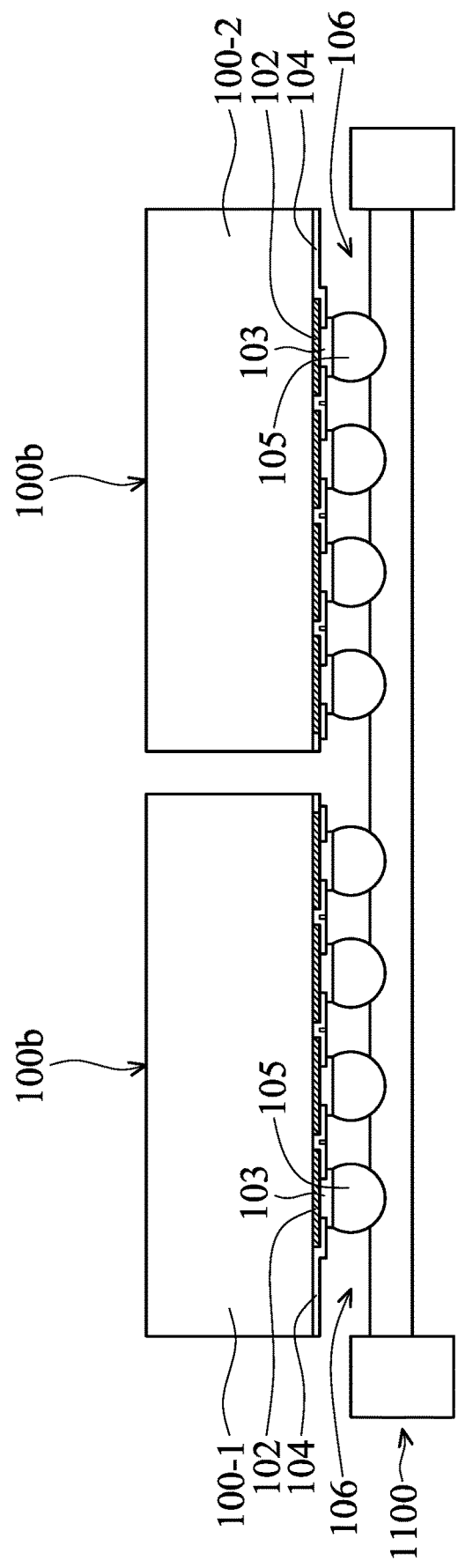

After the bump structures 106 are formed, singulated semiconductor dies 100 are formed, as shown in FIG. 1B in accordance with some embodiments. As shown in FIG. 1B, the semiconductor wafer 1000 is flipped to attach the bump structures 106 on a carrier 1100, in accordance with some embodiments. The carrier 1100 may include a tape layer which serves as a temporary carrier tape and is easily detached from the bump structures 106.

Afterwards, the rear surface 100b (which is also referred to as a non-active surface) of semiconductor wafer 1000 is diced along the scribe lines (not shown) of the semiconductor wafer 1000 by a sawing process, an etching process, or a combination thereof. For example, the rear surface 100b of semiconductor wafer 1000 may be diced by a sawing process using one or more blades.

Figure 1C:
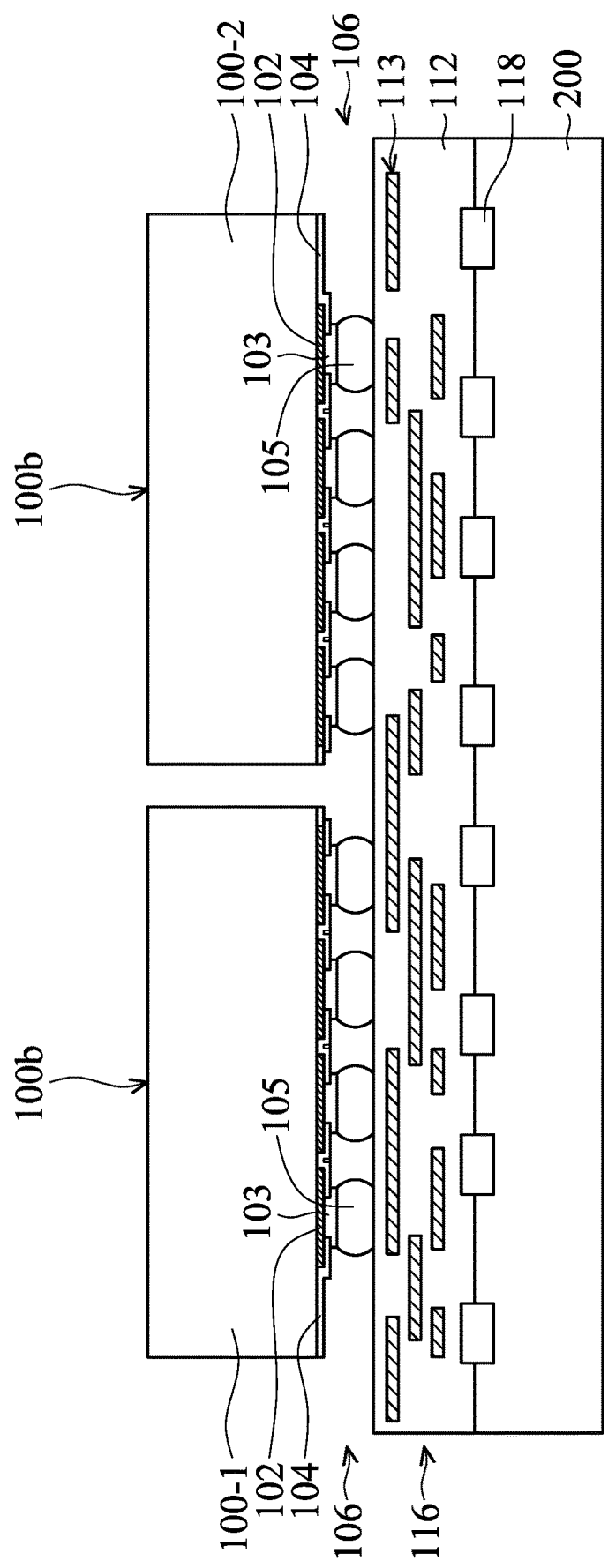

After the semiconductor wafer 1000 is diced to form the singulated semiconductor dies 100-1 and 100-2, an interposer substrate 116 formed over a carrier substrate 200 is provided and bonded with the interconnect structure of the semiconductor dies 100-1 and 100-2, as shown in FIG. 1C in accordance with some embodiments. In some embodiments, a carrier substrate 200 with a de-bonding layer (not shown) coated thereon is provided. The carrier substrate 200 may be a glass carrier substrate, a ceramic carrier substrate or any suitable carrier substrate for carrying a semiconductor wafer for the manufacturing method of the chip package structure. The de-bonding layer may include a light-to-heat conversion (LTHC) layer or an adhesive layer (such as a ultra-violet curable adhesive or a heat curable adhesive layer). The de-bonding layer is decomposable under the heat of light, so as to remove the carrier substrate 200 from the overlying structure (e.g., the interposer substrate 116) in the subsequent steps.

In some embodiments, the interposer substrate 116 includes a redistribution layer (RDL) structure 113 that is formed in a base layer 112 and covered by a passivation layer 118 that is attached onto the carrier substrate 200 via the de-bonding layer.

The redistribution structure 113 may be used as a fan-out RDL structure for routing. More specifically, the redistribution structure 113 includes one or more conductive layers (such as two or three conductive layers) embedded within one or more dielectric layers (which form the base layer 112). The redistribution structure 113 provides not only conductive routing for signals, but may also provide structures such as integrated inductors or capacitors. In some embodiments, the dielectric layers include an organic material such as polybenzoxazole (PBO), polyimide (PI), one or more other suitable polymer materials, or a combination thereof. In those cases, the interposer substrate 116 is also referred to as an organic substrate or an organic interposer. The dielectric layers may be formed by, for example, a spin-coating process, although any suitable method may be used. After the first of the dielectric layers has been formed, openings (not shown) may be made through the first dielectric layer.

Once the first dielectric layer has been formed and patterned, the first of the conductive layers (such as copper) is formed over the first dielectric layer and through the openings that were formed within the first dielectric layer. In some embodiments, the first conductive layer is formed using a suitable formation process, such as electroplating, chemical vapor deposition (CVD) or sputtering. However, while the material and methods discussed are suitable to form the conductive layer, this material is merely exemplary. Any other suitable materials, such as aluminum, tungsten, nickel, titanium, gold, platinum, silver, another suitable material, or a combination thereof, and any other suitable processes of formation, such as CVD or physical vapor deposition (PVD), may be used to form the conductive layers.

Once the first conductive layer has been formed, a second dielectric layer and a second conductive layer may be formed by repeating steps that are similar to the steps for the first dielectric layer and first conductive layer. These steps may be repeated as desired in order to form an electrical connection between the conductive layers. In some embodiments, the deposition and patterning of the conductive layers and the dielectric layers may be continued until the redistribution structure 113 has the desired number of conductive layers.

The passivation layer 118 may be a single layer or a multi-layer structure. In some embodiments, the passivation layer 118 is a single layer and has openings exposing some conductive layers of the redistribution structure 113. Bond pads (not shown) may be formed over the exposed redistribution structure 113. The passivation layer 118 is made of dielectric material(s) and provides stress relief for bonding stress incurred during subsequent bonding processes. For example, the passivation layer 118 may be made of a polymer material, such as PI, PBO, BCB, the like, or a combination thereof. Alternatively or additionally, the passivation layer 118 may include silicon oxide, silicon oxynitride, silicon nitride, silicon carbide, another suitable material, or a combination thereof.

Multiple deposition, coating, and/or etching processes may be used to form the interposer substrate 116 including the redistribution structure 113, the base layer 112, and the passivation layer 118. In some embodiments, one or more thermal processes are performed during the formation the interposer substrate 116. For example, portions of the passivation layer 118 may be made of a polymer material that is formed using a process involving a thermal operation.

After the interposer substrate 116 is provided, at least two semiconductor dies 100-1 and 100-2 are removed from the carrier 1100 and placed over the redistribution structure 113 using, for example, a pick and place tool (not shown) and then the bump structures 106 of the semiconductor dies 100-1 and 100-2 are mounted over the interposer substrate 116.

For example, two homogeneous semiconductor dies 100-1 and 100-2 may be mounted over the interposer substrate 116 through the respective bump structures 106. For example, both of the semiconductor die 100-1 and the semiconductor die 100-2 are logic die or SoC dies. Optional under bump metallization (UBM) layers (not shown) and the overlying solder bump structures (not shown) may be correspondingly formed below the bump structures 106 and on the interposer substrate 116 prior to the placement of the semiconductor die 100-1 and the semiconductor dies 100-2. In some embodiments, the semiconductor die 100-1 and the semiconductor dies 100-2 are arranged in a side by side manner.

Figure 1D:
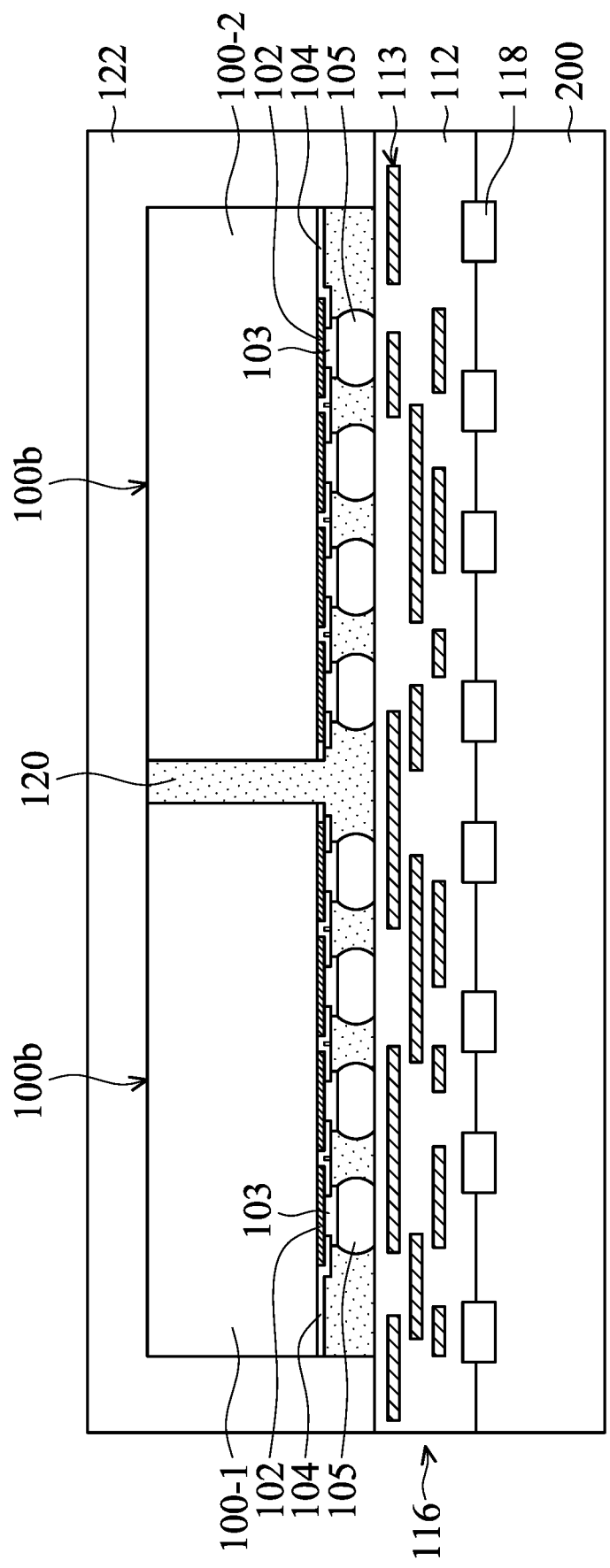

After the semiconductor die 100-1 and the semiconductor dies 100-2 are bonded onto the interposer substrate 116, an encapsulating layer (which is also referred to as a package layer) is formed over the interposer substrate 116 to cover the semiconductor die 100-1 and the semiconductor dies 100-2, as shown in FIG. 1D in accordance with some embodiments. More specifically, as shown in FIG. 1D, the encapsulating layer includes a first material layer 122 and a second material layer 120. The first material layer 122 of the encapsulating layer surrounds sidewalls of the semiconductor die 100-1 and the semiconductor dies 100-2 and covers the upper surfaces of the semiconductor die 100-1 and the semiconductor dies 100-2 (i.e., the rear surfaces 100b (or non-active surfaces) of the semiconductor die 100-1 and the semiconductor dies 100-2). The second material layer 120 extends between opposite sidewalls of the semiconductor die 100-1 and the semiconductor die 100-2, between the interposer substrate 116 and the semiconductor die 100-1, and between the interposer substrate 116 and the semiconductor die 100-2.

In some embodiments, the first material layer 122 is made of a material that is different than that of the second material layer 120. More specifically, the first material layer 122 is made of a molding compound material. In those cases, the first material layer 122 is referred to as a molding compound layer. In some embodiments, the second material layer 120 is made of an underfill material. In those cases, the second material layer 120 is referred to as an underfill material layer.

The underfill material layer (e.g., the second material layer 120) is employed to protect and support the semiconductor die from operational and environmental degradation, such as stresses caused by the generation of heat during operation. The underfill material may be made of an epoxy-based resin or other protective material. In some embodiments, the formation of the underfill material layer involves an injecting process, a dispensing process, a film lamination process, one or more other applicable processes, or a combination thereof. In some embodiments, a thermal curing process is then used to cure the underfill material layer.

In some embodiments, after the second material layer 120 is formed, the molding compound material layer (e.g., the first material layer 122) is formed to encapsulate the second material layer 120, the semiconductor die 100-1, and the semiconductor die 100-2, so that the sidewalls of the semiconductor die 100-1 and the semiconductor die 100-2 uncovered by the underfill material layer are covered by the first material layer 122.

In some embodiments, the first material layer 122 of the insulating layer includes a molding compound. For example, a liquid molding compound material is applied over the interposer substrate 116, the semiconductor die 100-1, and the semiconductor die 100-2. Afterwards, a thermal process is then applied to harden the liquid molding compound material.

Figure 1E:
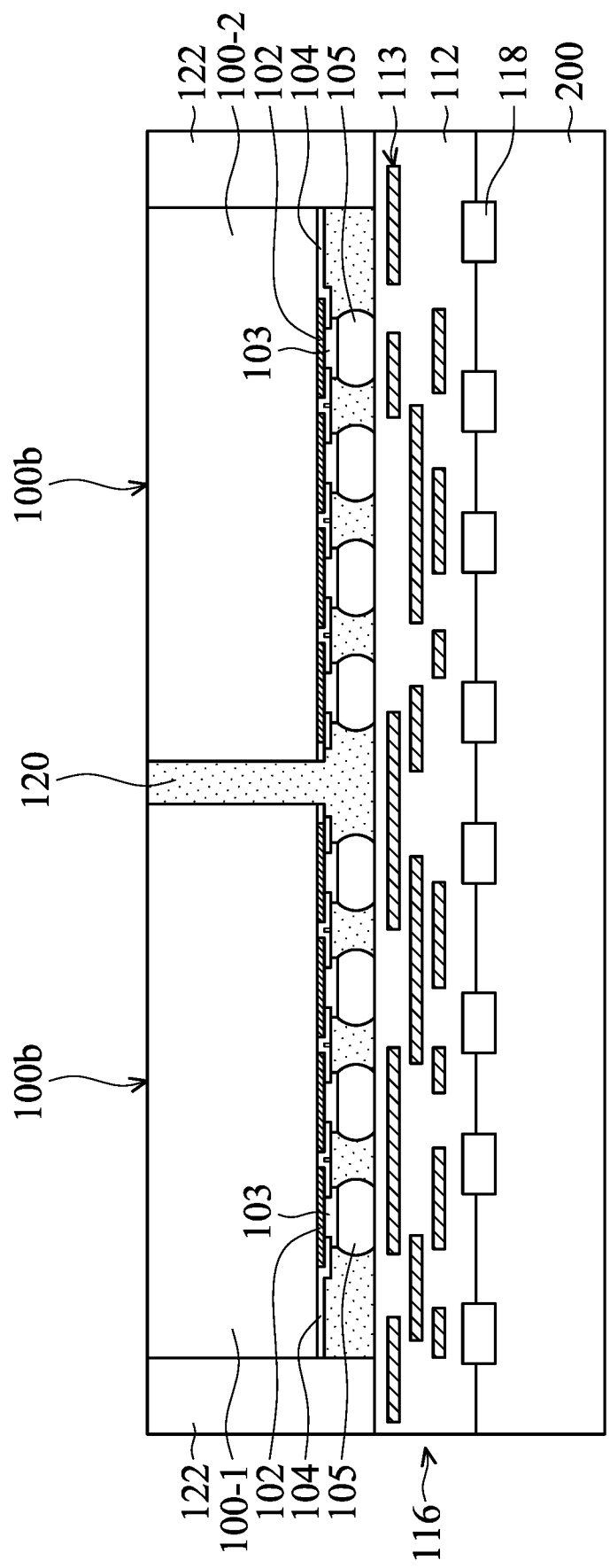

Afterwards, the hardened molding compound material layer is etched back to expose the upper surfaces of the second material layer 120 (e.g., the underfill material layer), the semiconductor die 100-1, and the semiconductor die 100-2, as shown in FIG. 1E in accordance with some embodiments. For example, a planarization process may be used to thin the hardened molding compound material layer (e.g., the first material layer 122). The planarization process may include a grinding process, a chemical mechanical polishing (CMP) process, an etching process, another applicable process, or a combination thereof. As a result, the upper surfaces of the first material layer 122, the second material layer 120, the semiconductor die 100-1, and the semiconductor die 100-2 are substantially level with each other.

Figure 1F:
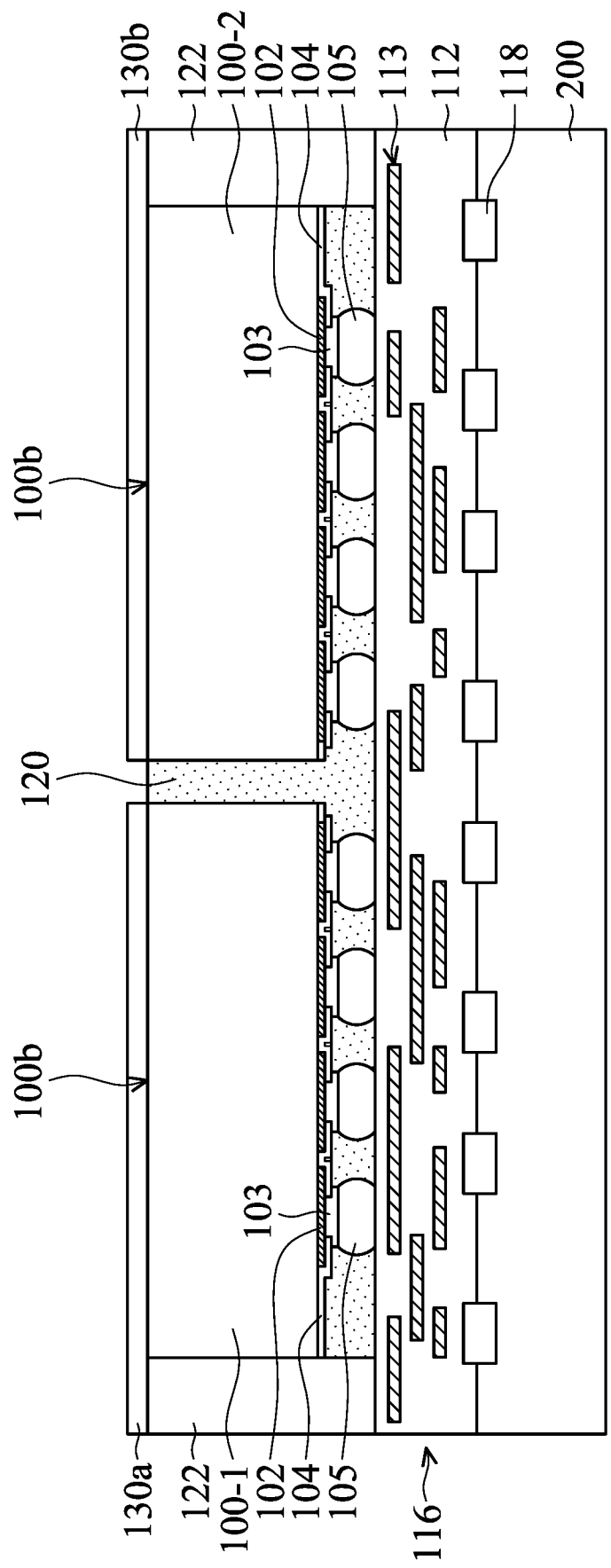
Figure 1G:
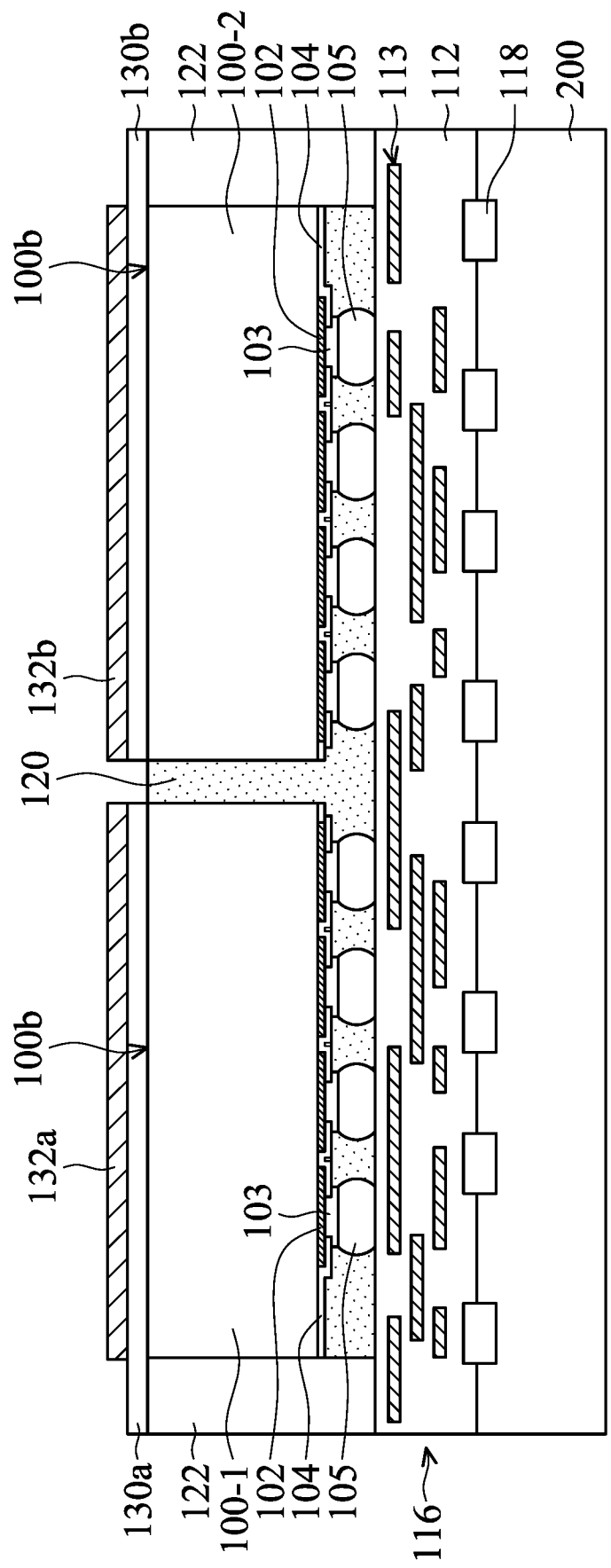

After the planarization process, a warpage release layer structure is formed over the structure shown in FIG. 1E for warpage reduction, as shown in FIGS. 1F to 1G in accordance with some embodiments. In some embodiments, the formation of the warpage release layer structure includes forming an organic material (not shown) to cover the structure shown in FIG. 1E. As a result, the organic material is in direct contact with the upper surfaces of the first material layer 122, the second material layer 120, the semiconductor die 100-1, and the semiconductor die 100-2.

Afterwards, the organic material is patterned to form an organic material layer 130a in direct contact with the rear/non-active surface 100b of the semiconductor die 100-1 and an organic material layer 130b in direct contact with the rear/non-active surface 100b of the semiconductor die 100-2. The organic material layers 130a and 130b expose the entire upper surface of the second material layer 120 and respectively cover the entire upper surfaces of the semiconductor die 100-1 and the semiconductor die 100-2.

In some embodiments, the organic material layers 130a and 130b have a thickness that is in a range from about 2.5 μm to about 5 μm and is made of a polymer material or a polymer-containing layer, such as PI, PBO, BCB, or the like. The organic material layer may be made of or include polyimide (PI), formed by a suitable deposition process (e.g., a spin-coating, CVD or plasma-enhanced CVD (PECVD) process), and patterned by a lithography process. Therefore, the organic material layers 130a and 130b are referred to as polyimide layers.

After the organic material layers 130a and 130b is formed, the formation of the warpage release layer structure further includes forming a high coefficient of thermal expansion (CTE) material layer 132a and a high CTE material layer 132b over the organic material layer 130a and the organic material layer 130b, respectively, as shown in FIG. 1G in accordance with some embodiments. In some embodiments, the high CTE material layers 132a and 132b are separated from each other and respectively correspond to the semiconductor dies 100-1 and 100-2. As a result, the high CTE material layers 132a and 132b cover the upper surfaces of the semiconductor dies 100-1 and 100-2, respectively.

In some embodiments, the high CTE material layer 132a (which is also referred to as a high CTE material plate) has a planar shape that is the same as a planar shape of the semiconductor die 100-1, so that the edges of the high CTE material layer 132a are substantially aligned to the corresponding edges of the semiconductor die 100-1. Similarly, the high CTE material layer 132b (which is also referred to as a high CTE material plate) has a planar shape that is the same as a planar shape of the semiconductor die 100-2, so that the edges of the high CTE material layer 132b are substantially aligned to the corresponding edges of the semiconductor die 100-2.

In some embodiments, the high CTE material layers 132a and 132b have a CTE that is substantially equal to or greater than 9 ppm/° C., and are made of or include a metal material. The metal material may include copper (Cu), gold (Au), aluminum (Al), cobalt (Co), tungsten (W), or an alloy thereof and formed by a plating process, a CVD process, a physical vapor deposition (PVD) process, a sputtering process, or another applicable process. For example, a patterned resist layer (not shown), such as a dry film, is formed over the organic material layers 130a and 130b and the second material layer 120 by a lithography process. The patterned resist layer has openings directly above the semiconductor dies 100-1 and 100-2 to expose portions of the organic material layers 130a and 130b. Afterwards, a plating process is performed to form a metal material layer (e.g., a copper layer) in each of the openings of patterned resist layer. Afterwards, the patterned resist layer is removed to form high CTE material layers 132a and 132b including metal material. Therefore, the high CTE material layers 132a and 132b are also referred to as metal layers.

The warpage release layer structure including the organic material layers 130a and 130b and the high CTE material layers 132a and 132b can be used to prevent or mitigate the warpage of the subsequently formed chip package structure. As a result, the performance and quality of the chip package structure are improved.

Figure 1H:
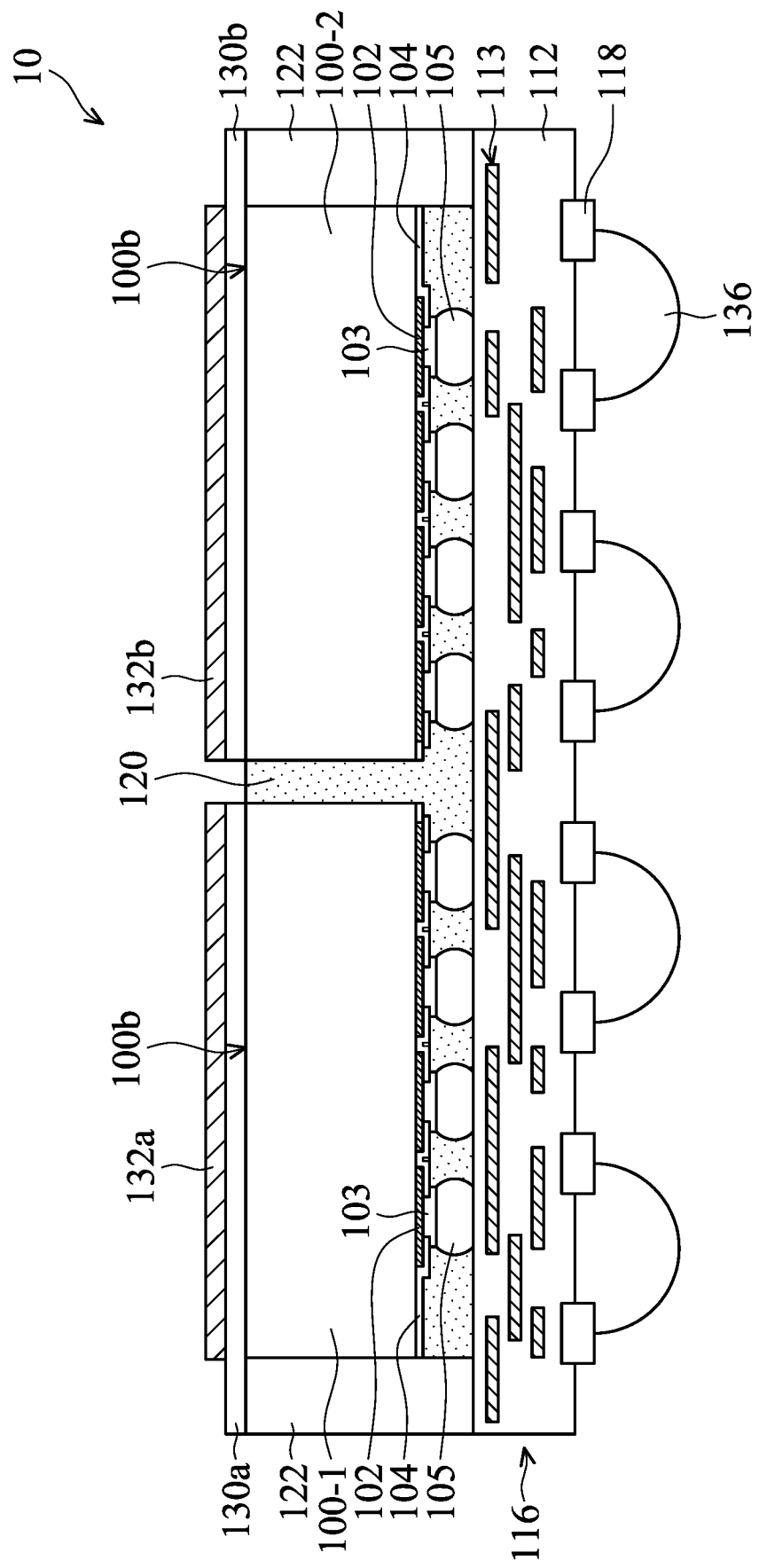

After the formation of the warpage release layer structure, the carrier substrate 200 is removed and electrical connectors 136 (e.g., controlled collapse chip connection (C4) bumps) are formed in the passivation layer 118 of the interposer substrate 116 to form a chip package structure 10, as shown in FIG. 1H in accordance with some embodiments. More specifically, the warpage release layer structure shown in FIG. 1G may be attached to a tape supported by a frame (not shown). Subsequently, the carrier substrate 200 is de-bonded so as to separate the interposer substrate 116 and the overlying structure from the carrier substrate 200. In the some embodiments, a de-bonding process includes projecting a light such as a laser light or an UV light on the de-bonding layer (e.g., the LTHC layer) on the carrier substrate 200, such that the carrier substrate 200 can be easily removed. In some embodiments, the de-bonding layer is further removed or peeled off.

After the removal of the carrier substrate 200, the electrical connectors 136 may be solder balls and formed in the openings of the passivation layer 118 that exposes bond pads (not shown) of the redistribution structure 113 by using a ball-mounting head (not shown). As a result, a chip package structure 10 is formed, as shown in FIG. 1H.

In some embodiments, the electrical connectors 136 have a size that is greater than that of the electrical connectors 105. The electrical connectors 136 may be made of a material such as tin, silver, lead-free tin, or copper. The electrical connectors 136 serve as an electrical connection between the interposer substrate 116 and an external circuit (not shown). Optional under bump metallization (UBM) layers (not shown) may be correspondingly formed between the bond pads of the redistribution structure 113 and the electrical connectors 136.

It should be noted that although there are two semiconductor dies 100-1 and 100-2 formed in the chip package structure 10, the number of the semiconductor dies is based on design demands and is not limited to the embodiments shown in FIG. 1H. In some embodiments, more than two semiconductor dies are arranged in the chip package structure 10, and each of the semiconductor dies is covered by a respective high CTE material layer.

After the chip package structure 10 is formed, a flux-dipping process is performed on the electrical connectors 136 at a room temperature in accordance with some embodiments, so as to form flux layers covering respective electrical connectors 136. Afterwards, a flip chip bonding (FCB) process is performed on the electrical connectors 136 at high temperature, so as to bond the chip package structure 10 to a package substrate (not shown) that is used for connecting an external circuit (not shown).

During the flux-dipping process and the subsequent FCB process, warpage of the chip package structure 10 may occur due to the CTE mismatch between the semiconductor dies 100-1 and 100-2 and the interposer substrate 116. However, the warpage release layer structure with high CTE material therein can compensate the CTE difference between the semiconductor dies and the interposer substrate. As a result, the warpage of the chip package structure 10 can be effectively controlled or reduced. Therefore, the non-uniform flux (or no flux) problem after the flux-dipping process can be addressed or mitigated, thereby increasing the flux-dipping process window. Also, the cold joint and bridge problems after the FCB process can be addressed or mitigated, thereby increasing device yield after the FCB process.

Figures 1, 1H:
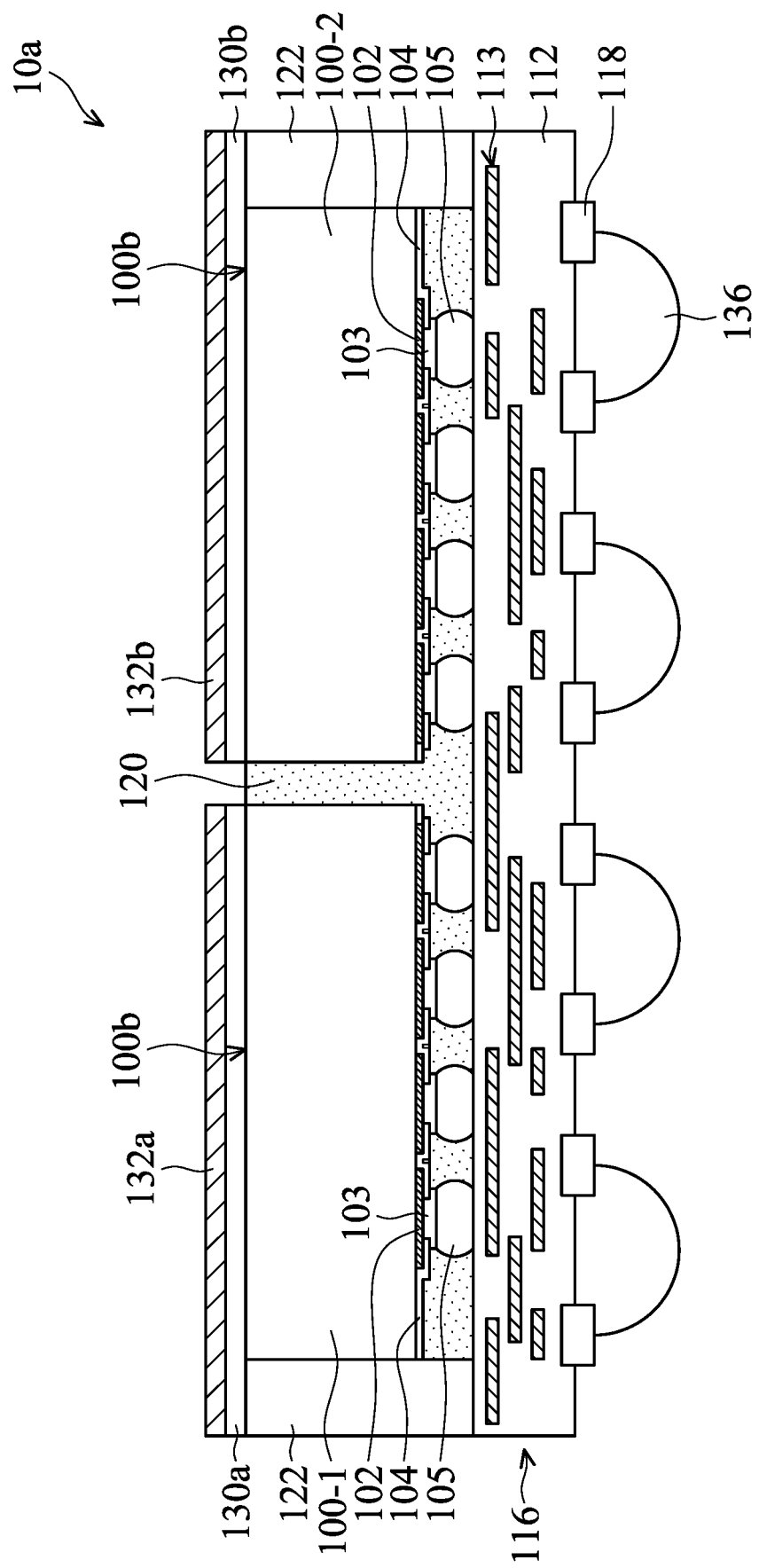

Many variations and/or modifications can be made to embodiments of the disclosure. For example, in the chip package structure 10 shown in FIG. 1H, the edges of the high CTE material layer 132a are substantially aligned to the corresponding edges of the semiconductor die 100-1, and the edges of the high CTE material layer 132b are substantially aligned to the corresponding edges of the semiconductor die 100-2. However, embodiments of the disclosure are not limited thereto. FIG. 1H-1 shows a cross-sectional view of a chip package structure 10a, in accordance with some embodiments. The chip package structure 10a shown in FIG. 1H-1 is similar to the chip package structure 10 shown in FIG. 1H. In some embodiments, the materials, formation methods, and/or benefits of the chip package structure 10 shown in FIGS. 1A to 1H can also be applied in the embodiments illustrated in FIG. 1H-1, and are therefore not repeated. Unlike the chip package structure 10 shown in FIG. 1H, the edges of the high CTE material layers 132a and 132b in the chip package structure 10a shown in FIG. 1H-1 are not aligned to the corresponding edges of the semiconductor dies 100-1 and 100-2, respectively. More specifically, the edges of the high CTE material layer 132a are substantially aligned to the corresponding edges of the organic material layer 130a. Also, the edges of the high CTE material layer 132b are substantially aligned to the corresponding edges of the organic material layer 130b.

Figures 1, 1H, 2:
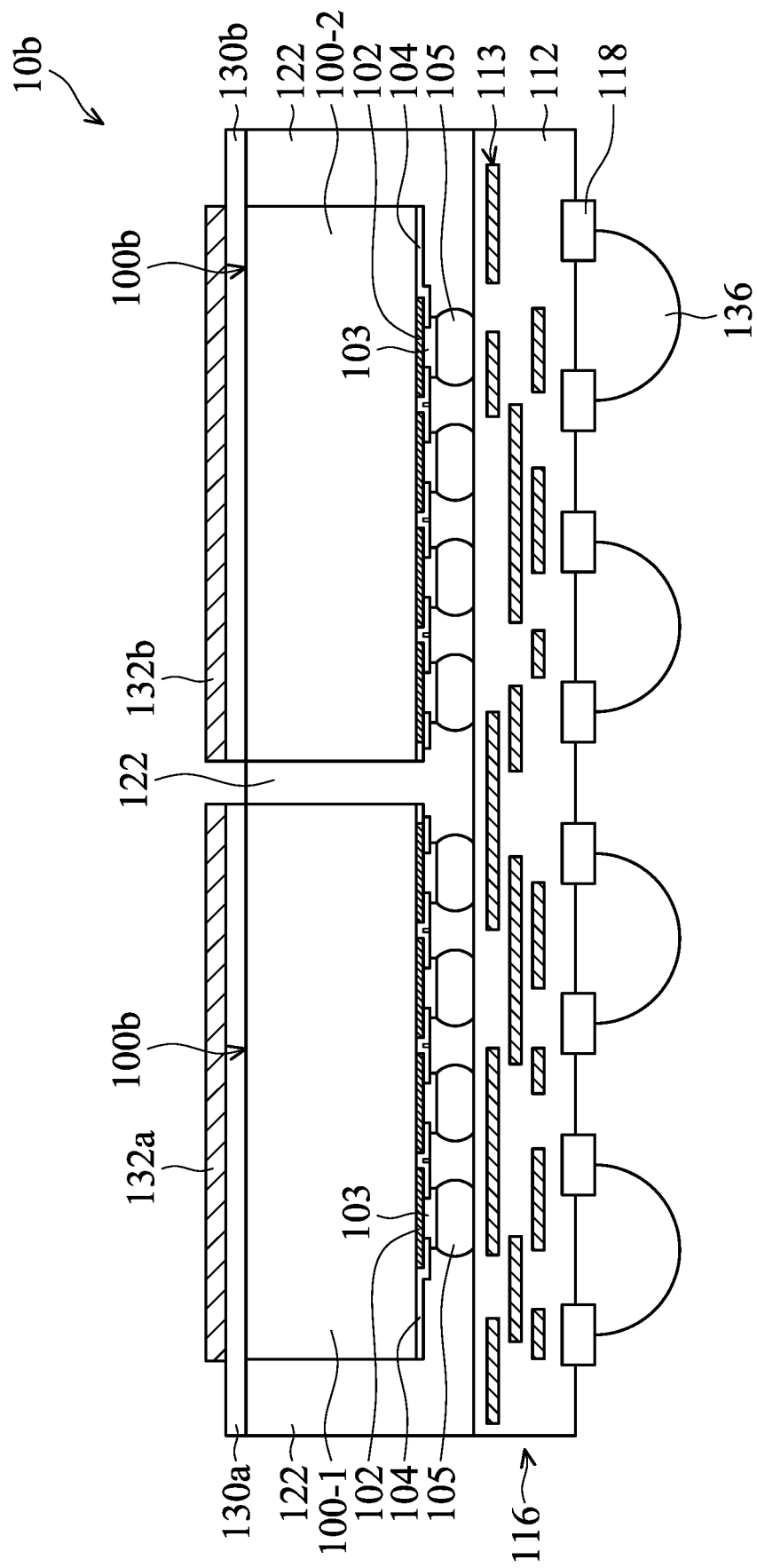

Many variations and/or modifications can be made to embodiments of the disclosure. For example, the chip package structure 10 shown in FIG. 1H employs an encapsulating layer including the underfill material layer, but embodiments of the disclosure are not limited thereto. FIG. 1H-2 shows a cross-sectional view of a chip package structure 10b, in accordance with some embodiments. The chip package structure 10b shown in FIG. 1H-2 is similar to the chip package structure 10 shown in FIG. 1H. In some embodiments, the materials, formation methods, and/or benefits of the chip package structure 10 shown in FIGS. 1A to 1H can also be applied in the embodiments illustrated in FIG. 1H-2, and are therefore not repeated. Unlike the chip package structure 10 shown in FIG. 1H, the encapsulating layer in the chip package structure 10b shown in FIG. 1H-2 includes a homogeneous or single material. More specifically, the first material layer 122 is made of a molding compound that is the same as that of the second material layer 120.

Many variations and/or modifications can be made to embodiments of the disclosure. For example, the chip package structure 10 shown in FIG. 1H includes two homogeneous semiconductor dies (e.g., the semiconductor die 100-1 and the semiconductor die 100-2), but embodiments of the disclosure are not limited thereto. FIGS. 2A to 2E illustrate cross-sectional views of various stages of a method for forming a chip package structure 20 having at least two heterogeneous semiconductor dies, in accordance with some embodiments. In some embodiments, the materials, formation methods, and/or benefits of the chip package structure 10 shown in FIGS. 1A to 1H may also be applied in the embodiments illustrated in FIGS. 2A to 2E, and may be therefore not repeated.

Additional operations can be provided before, during, and/or after the stages described in FIGS. 2A to 2E. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
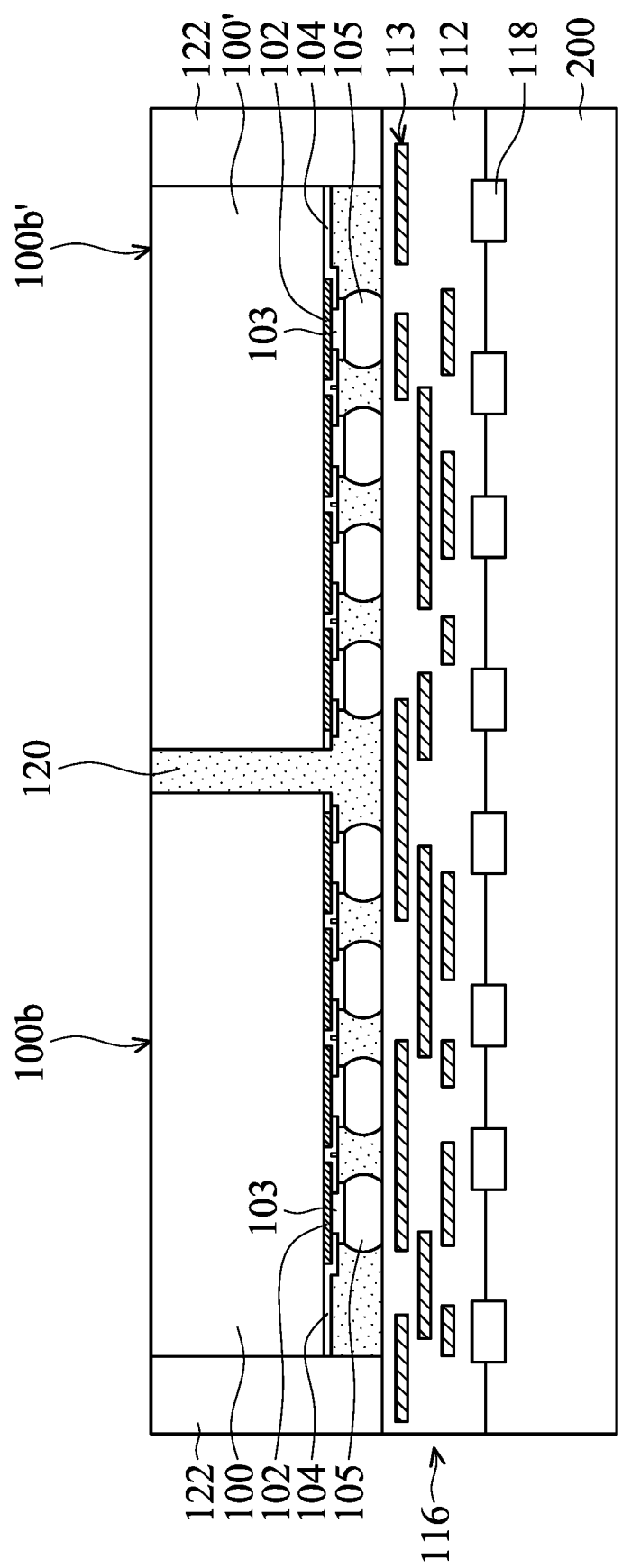
FIGS. 2A to 2E are cross-sectional views of various stages of a method for forming a chip package structure, in accordance with some embodiments.

A structure similar to the structure shown in FIG. 1E is provided, as shown in FIG. 2A in accordance with some embodiments. Unlike the structure shown in FIG. 1E, such a structure includes two heterogeneous semiconductor dies 100 and 100' that are arranged in a side by side manner, in accordance with some embodiments. For example, the semiconductor die 100 is a logic die (e.g., a CPU die, a GPU die, a MCU die, an AP die), or a SoC die. The semiconductor die 100' is a memory die or a different type die than the semiconductor die 100a, having a CTE greater than that of the semiconductor die 100. The rear/non-active surface 100b of the semiconductor die 100 and the rear/non-active surface 100b' of the semiconductor die 100' are exposed from the encapsulating layer including the first material layer 122 and the second material layer 120.

Figure 2B:
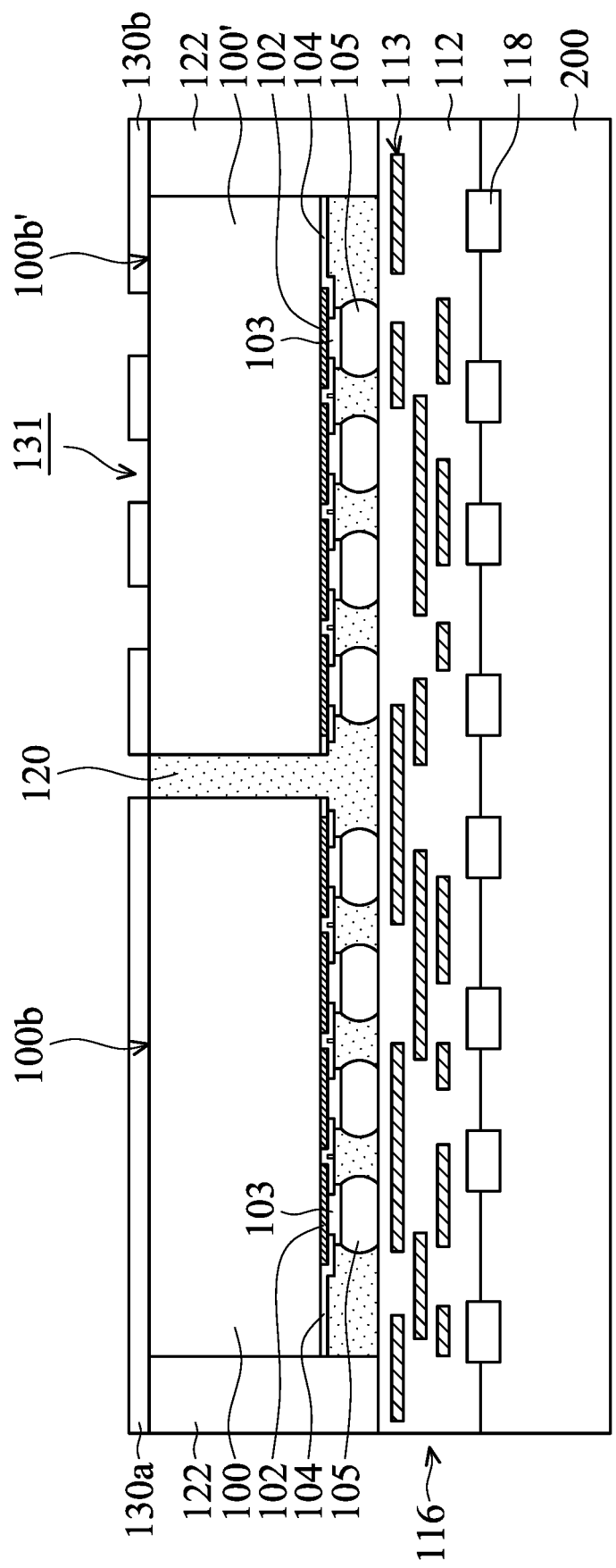
Figure 2C:
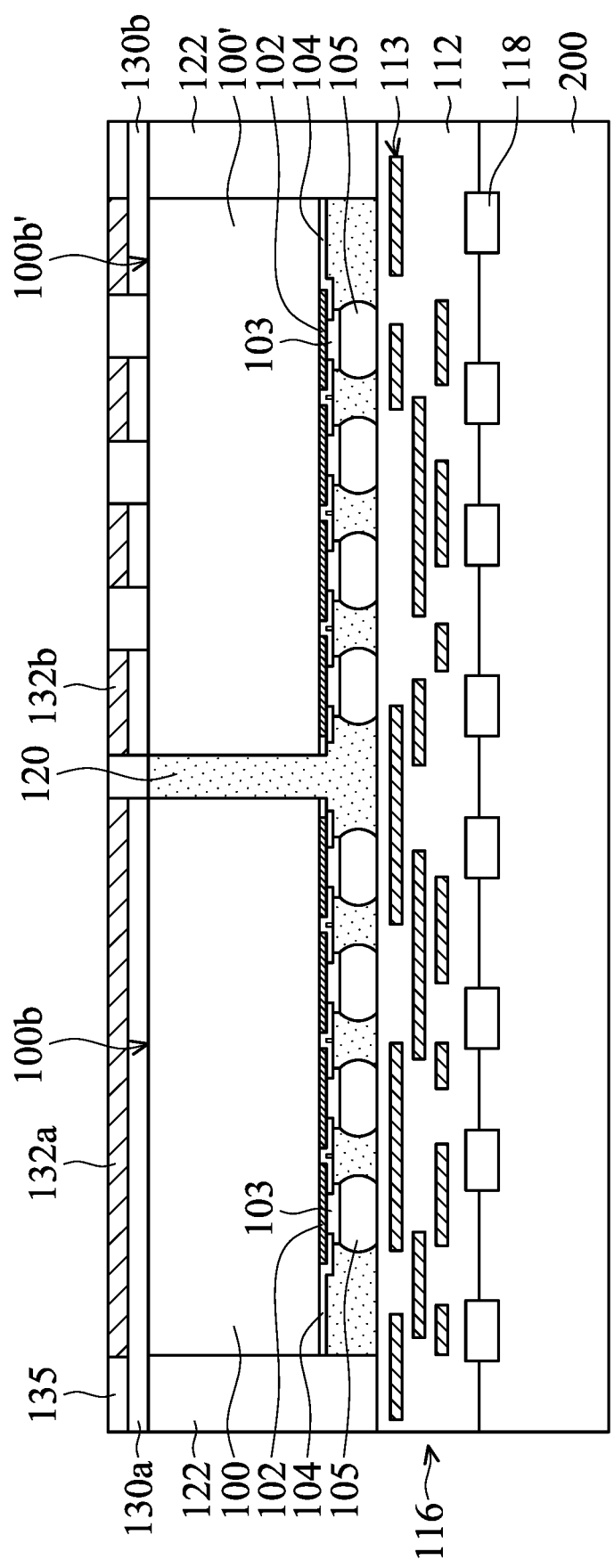
Figure 2D:
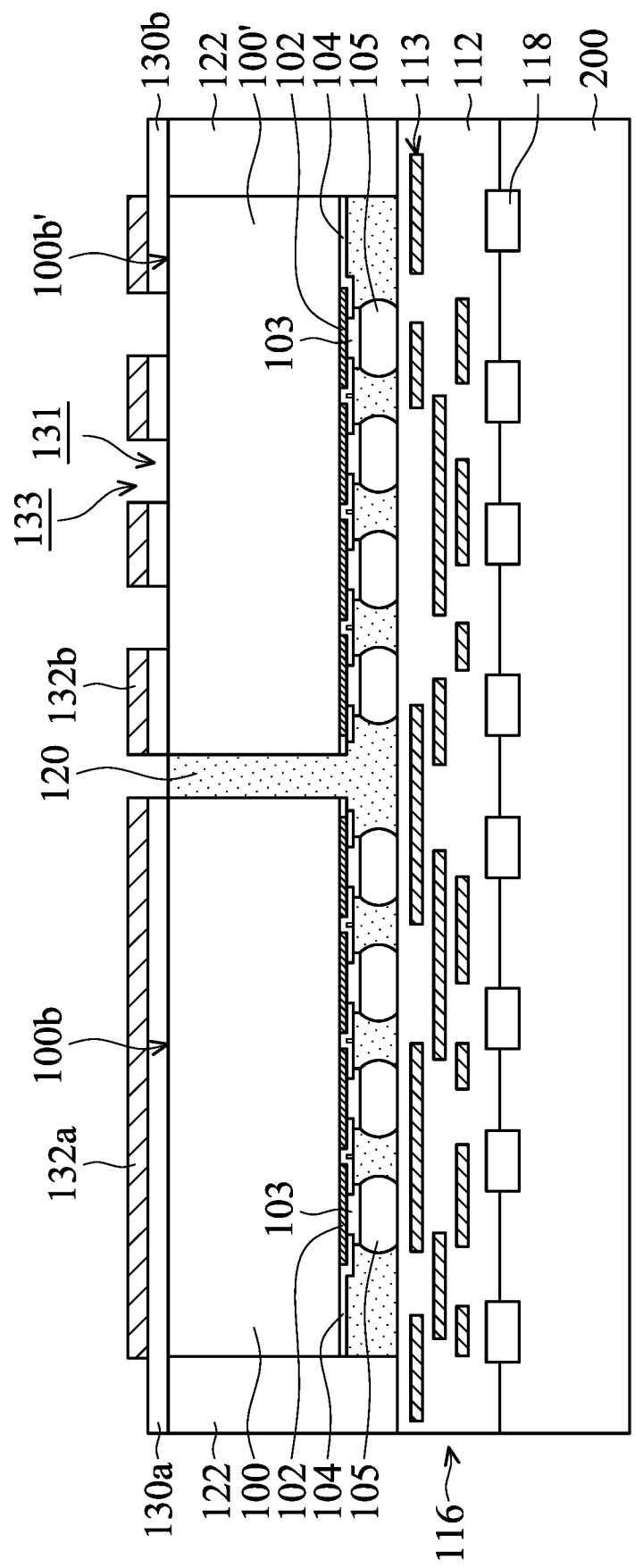

Afterwards, a warpage release layer structure is formed over the structure shown in FIG. 2A, as shown in FIGS. 2B to 2D in accordance with some embodiments. In FIG. 2B, organic material layers 130a and 130b are firstly formed. More specifically, the organic material layer 130a is in direct contact with the rear/non-active surface 100b of the semiconductor die 100 and the organic material layer 130b is in direct contact with the rear/non-active surface 100b' of the semiconductor die 100'.

Unlike the organic material layer 130b shown in FIG. 1F, the organic material layer 130b further includes openings 131 that expose portions of the rear/non-active surface 100b' of the semiconductor die 100' and may be arranged in an array. For example, the organic material layers 130a and 130b are made of a polymer material or a polymer-containing layer, formed by a suitable deposition process (e.g., a spin-coating), and patterned by a lithography process, as mentioned above.

Afterwards, the formation of the warpage release layer structure further includes forming high CTE material layers 132a and 132b over the organic material layers 130a and 130b, respectively, as shown in FIG. 2C in accordance with some embodiments. In some embodiments, the high CTE material layers 132a and 132b are separated from each other and respectively correspond to the semiconductor dies 100 and 100'. As a result, the high CTE material layers 132*a* and 132*b* cover the upper surfaces of the semiconductor dies 100 and 100', respectively.

In some embodiments, the high CTE material layer 132*a* has a planar shape that is the same as a planar shape of the semiconductor die 100, so that the edges of the high CTE material layer 132*a* are substantially aligned to the corresponding edges of the semiconductor die 100. Similarly, the high CTE material layer 132*b* has a planar shape that is the same as a planar shape of the semiconductor die 100', so that the edges of the high CTE material layer 132*b* are substantially aligned to the corresponding edges of the semiconductor die 100'.

As an example, a patterned resist layer 135, such as a dry film, is formed over the organic material layers 130*a* and 130*b* and the second material layer 120 and fills the opening 131 (not shown and as indicated in FIG. 2B) by a lithography process. The patterned resist layer 135 has openings directly above the semiconductor dies 100 and 100' to expose portions of the organic material layers 130*a* and 130*b* where the high CTE material layers 132*a* and 132*b* will be formed. Afterwards, a plating process is performed to form a metal material layer (e.g., a copper layer) in each of the openings of patterned resist layer 135. As a result, the high CTE material layers 132*a* and 132*b* including metal material is formed. Afterwards, the patterned resist layer 135 is removed from the structure shown in FIG. 2C, so as to leave the high CTE material layers 132*a* and 132*b* including metal material and form openings 133 in the high CTE material layer 132*b*, as shown in FIG. 2D in accordance with some embodiments.

Figure 5:
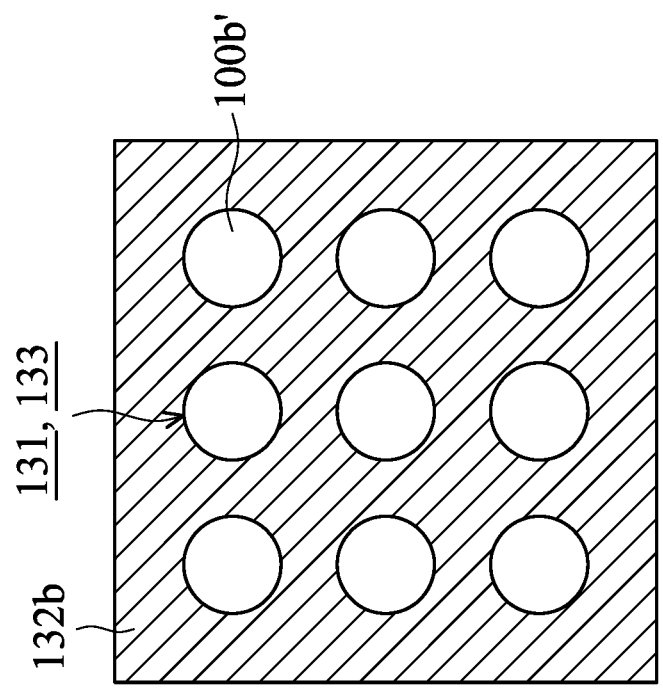
FIG. 5 is a plan view of a portion of warpage release layer structure shown in FIG. 2D, in accordance with some embodiments.
Figure 4:
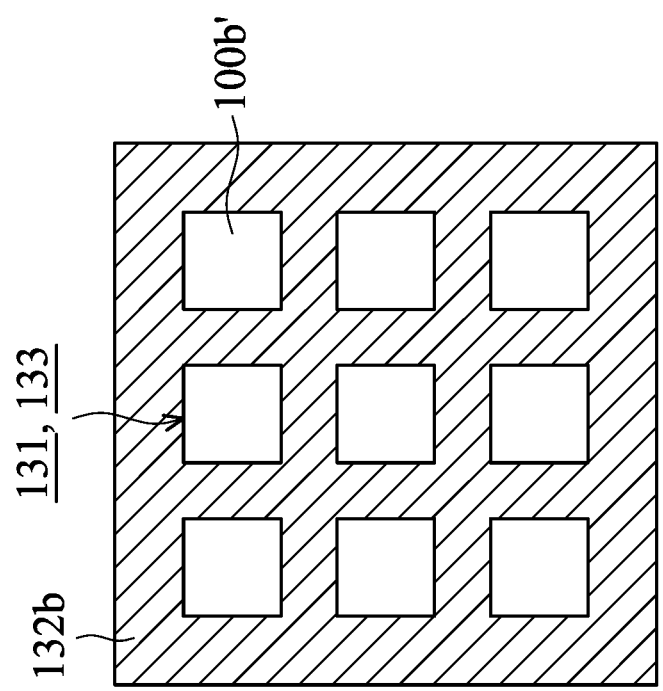
FIG. 4 is a plan view of a portion of warpage release layer structure shown in FIG. 2D, in accordance with some embodiments.

Unlike the high CTE material layer 132*b* shown in FIG. 1G, the openings 133 of the formed high CTE material layer 132*b* correspondingly expose the openings 131 after the removal of the patterned resist layer 135. The openings 131 and the above openings 133 form through holes in the warpage release layer structure corresponding to the semiconductor die 100'. In some embodiments, the size and the shape of the openings 131 are the same as those of the openings 133, as shown in FIG. 4, which illustrates a plan view of a portion of warpage release layer structure (e.g., the high CTE material layer 132*b*) shown in FIG. 2D, in accordance with some embodiments. It should be noted that the shape, size, and arrangement of the through holes are based on design demands and are not limited to the exemplary embodiment shown in FIG. 4. For example, although the through holes including openings 131 and 133 shown in FIG. 4 are square-shaped, those through holes can be circle-shaped, as shown in FIG. 5 in accordance with some embodiments. In some other embodiments, those through holes have triangular shape, rectangular shape, hexagonal shape, or another suitable shape.

The through holes can be used for reducing the contact area between the high CTE material layer 132*b* and the underlying organic material layer 130*b*. As a result, the CTE of the high CTE material layer 132*b* with openings 133 is less than the CTE of the high CTE material layer 132*a* without openings.

Since the CTE of the semiconductor die 100' is greater than that of the semiconductor die 100 and the CTE of the high CTE material layer 132*b* is less than the CTE of the high CTE material layer 132*a*, the CTE mismatch between the semiconductor die 100' and the semiconductor die 100 during the subsequent the flux-dipping process and FCB process can be mitigated or prevented by the warpage release layer structure with through holes.

Figure 2E:
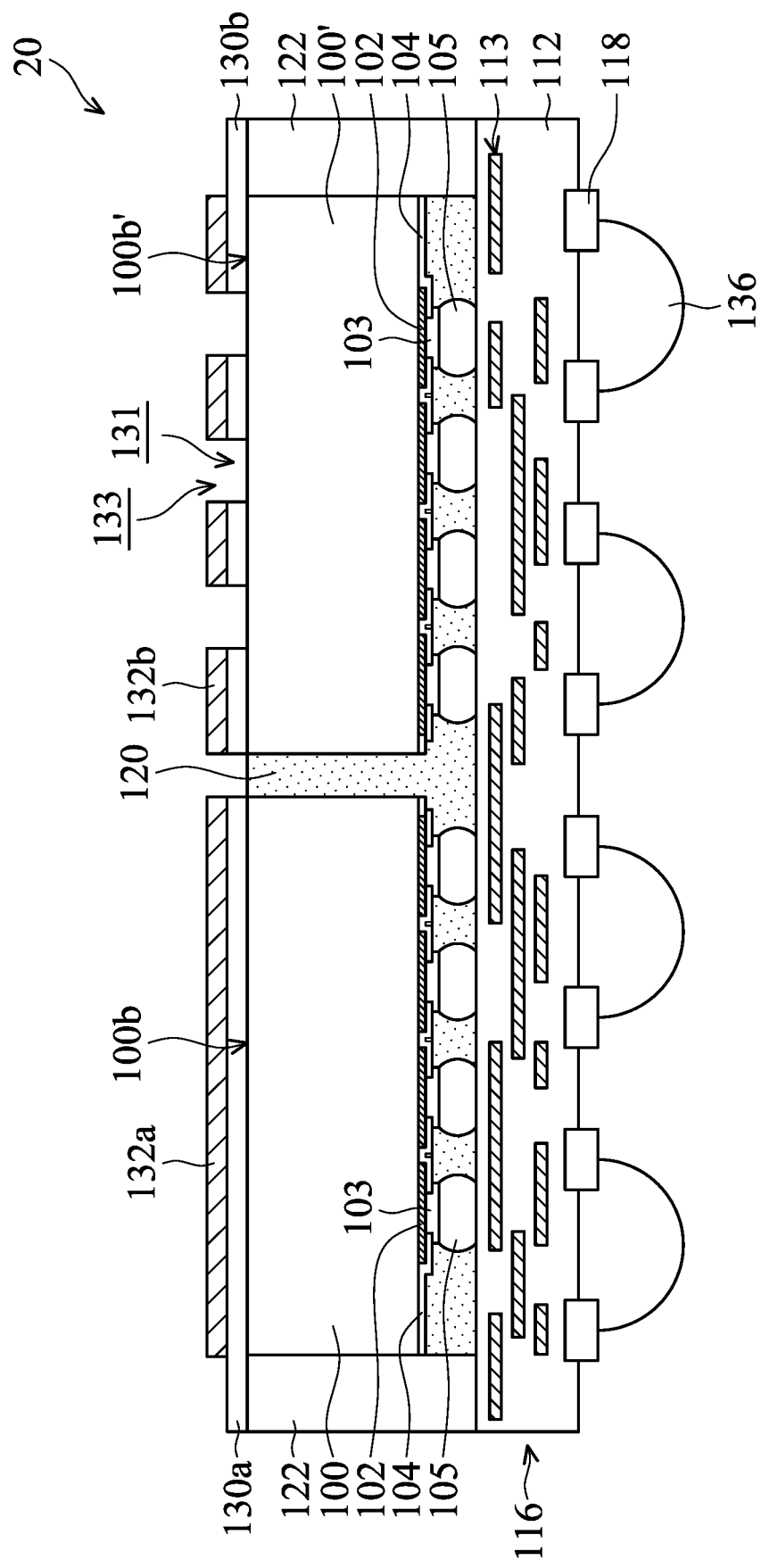
Figures 1, 2E:
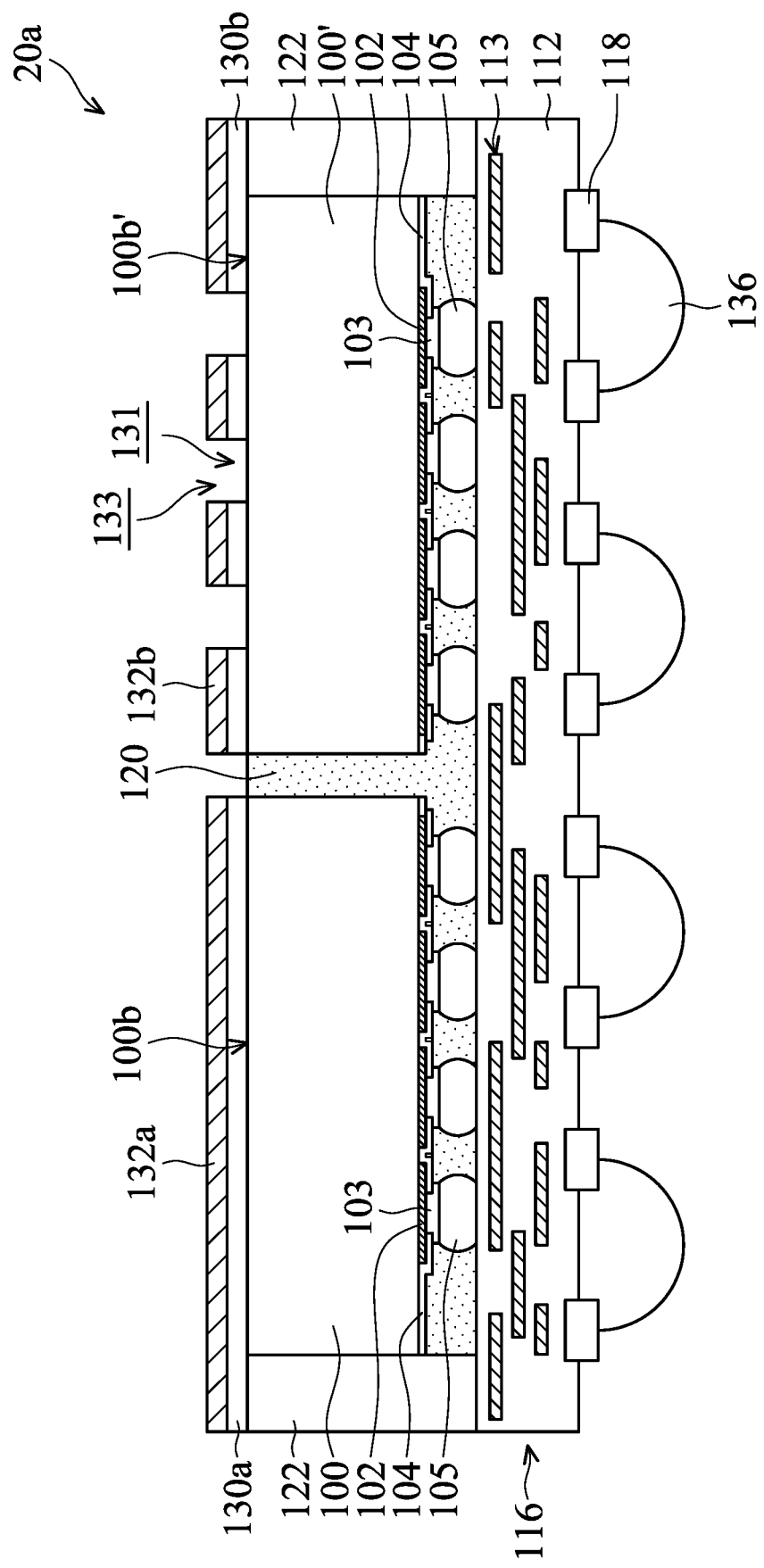
Figures 2, 2E:
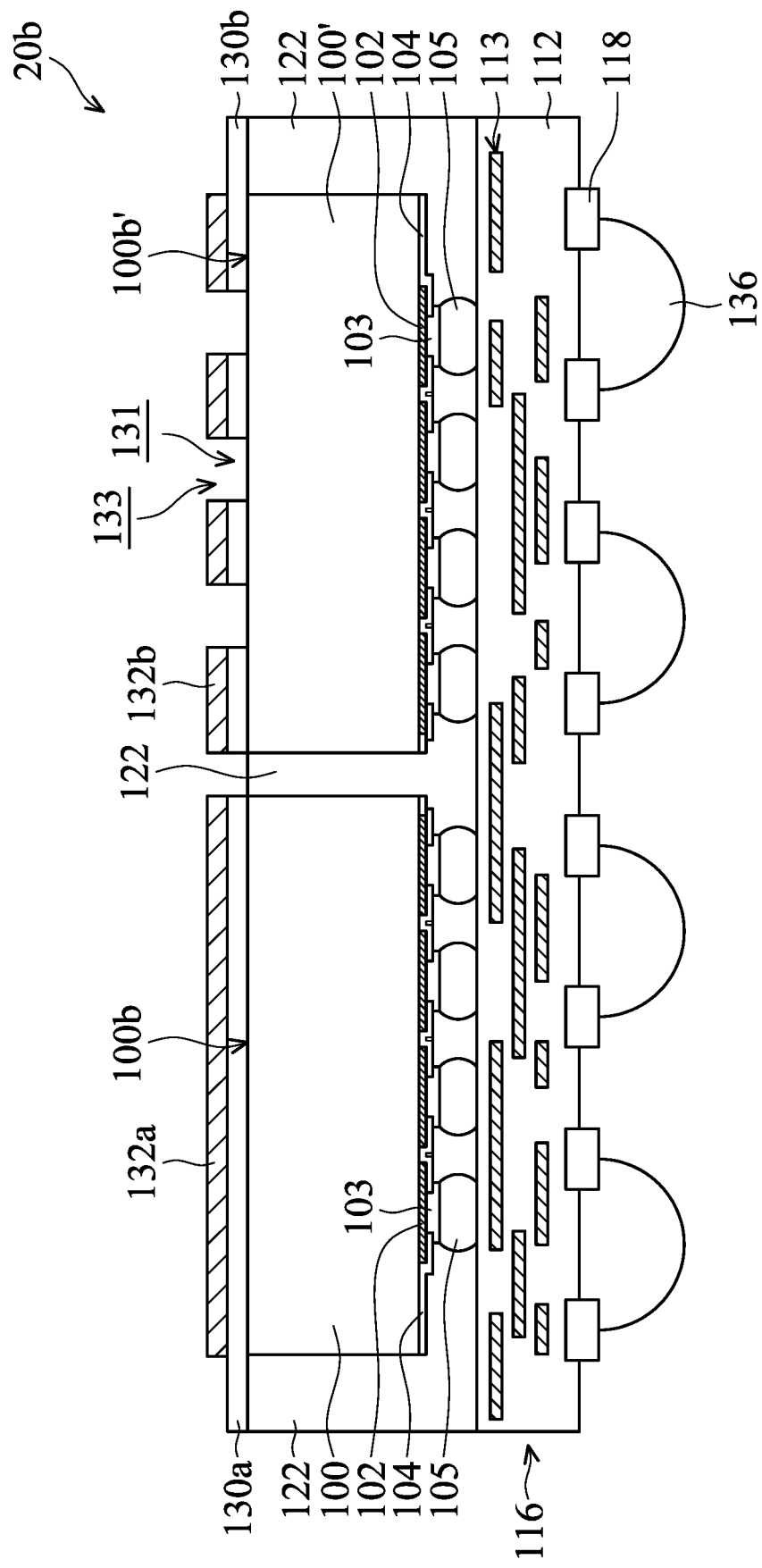

After the formation of the warpage release layer structure with through holes, the carrier substrate 200 is removed and electrical connectors 136 are formed in the passivation layer 118 of the interposer substrate 116 to form a chip package structure 20, as shown in FIG. 2E in accordance with some embodiments.

It should be noted that although there are two heterogeneous semiconductor dies 100 and 100' formed in the chip package structure 20, the number of the heterogeneous semiconductor dies is based on design demands and is not limited to the embodiments shown in FIG. 2E. In some embodiments, more than two heterogeneous semiconductor dies are arranged in the chip package structure 20, and each of the semiconductor dies is covered by a respective high CTE material layer.

After the chip package structure 20 is formed, a flux-dipping process is performed on the electrical connectors 136 at a room temperature in accordance with some embodiments, so as to form flux layers covering respective electrical connectors 136. Afterwards, an FCB process is performed on the electrical connectors 136 at high temperature, so as to bond the chip package structure 20 to a package substrate (not shown) that is used for connecting an external circuit (not shown).

The warpage release layer structure with through holes not only mitigates the CTE mismatch between the semiconductor dies 100 and 100', but also mitigates the CTE mismatch between the semiconductor dies 100 and 100' and the interposer substrate 116 during the subsequent flux-dipping and FCB processes. As a result, the warpage of the chip package structure 20 can be effectively controlled or reduced.

Many variations and/or modifications can be made to embodiments of the disclosure. For example, in the chip package structure 20 shown in FIG. 2E, the edges of the high CTE material layer 132*a* are substantially aligned to the corresponding edges of the semiconductor die 100, and the edges of the high CTE material layer 132*b* are substantially aligned to the corresponding edges of the semiconductor die 100'. However, embodiments of the disclosure are not limited thereto. FIG. 2E-1 shows a cross-sectional view of a chip package structure 20*a*, in accordance with some embodiments. The chip package structure 20*a* shown in FIG. 2E-1 is similar to the chip package structure 20 shown in FIG. 2E. In some embodiments, the materials, formation methods, and/or benefits of the chip package structure 20 shown in FIGS. 2A to 2E can also be applied in the embodiments illustrated in FIG. 2E-1, and are therefore not repeated. Unlike the chip package structure 20 shown in FIG. 2E, the edges of the high CTE material layers 132*a* and 132*b* in the chip package structure 20*a* shown in FIG. 2E-1 are not aligned to the corresponding edges of the semiconductor dies 100 and 100', respectively. More specifically, the edges of the high CTE material layer 132*a* are substantially aligned to the corresponding edges of the organic material layer 130*a*. Also, the edges of the high CTE material layer 132*b* are substantially aligned to the corresponding edges of the organic material layer 130*b*.

Many variations and/or modifications can be made to embodiments of the disclosure. For example, the chip package structure 20 shown in FIG. 2E employs an encapsulating layer including the underfill material layer, but embodiments of the disclosure are not limited thereto. FIG. 2E-2 shows a cross-sectional view of a chip package structure 20*b*, in accordance with some embodiments. The chip package structure 20*b* shown in FIG. 2E-2 is similar to the chip package structure 20 shown in FIG. 2E. In some embodiments, the materials, formation methods, and/or benefits of the chip package structure 20 shown in FIGS. 2A to 2E can also be applied in the embodiments illustrated in FIG. 2E-2, and are therefore not repeated. Unlike the chip package structure 20 shown in FIG. 2E, the encapsulating layer in the chip package structure 20b shown in FIG. 2E-2 includes a homogeneous or single material. More specifically, the first material layer 122 is made of a molding compound that is the same as that of the second material layer 120.

Many variations and/or modifications can be made to embodiments of the disclosure. For example, the chip package structure 20 shown in FIG. 2E includes the semiconductor die 100' with the CTE greater than that of the semiconductor die 100, but embodiments of the disclosure are not limited thereto. FIGS. 3A to 3E illustrate cross-sectional views of various stages of a method for forming a chip package structure 30 having the semiconductor die 100" with the CTE less than that of the semiconductor die 100, in accordance with some embodiments. In some embodiments, the materials, formation methods, and/or benefits of the chip package structure 20 shown in FIGS. 2A to 2E may also be applied in the embodiments illustrated in FIGS. 3A to 3E, and may be therefore not repeated. Additional operations can be provided before, during, and/or after the stages described in FIGS. 3A to 3E. Some of the stages that are described can be replaced or eliminated for different embodiments.

Additional features can be added to the semiconductor device structure. Some of the features described below can be replaced or eliminated for different embodiments. Although some embodiments are discussed with operations performed in a particular order, these operations may be performed in another logical order.

Figure 3A:
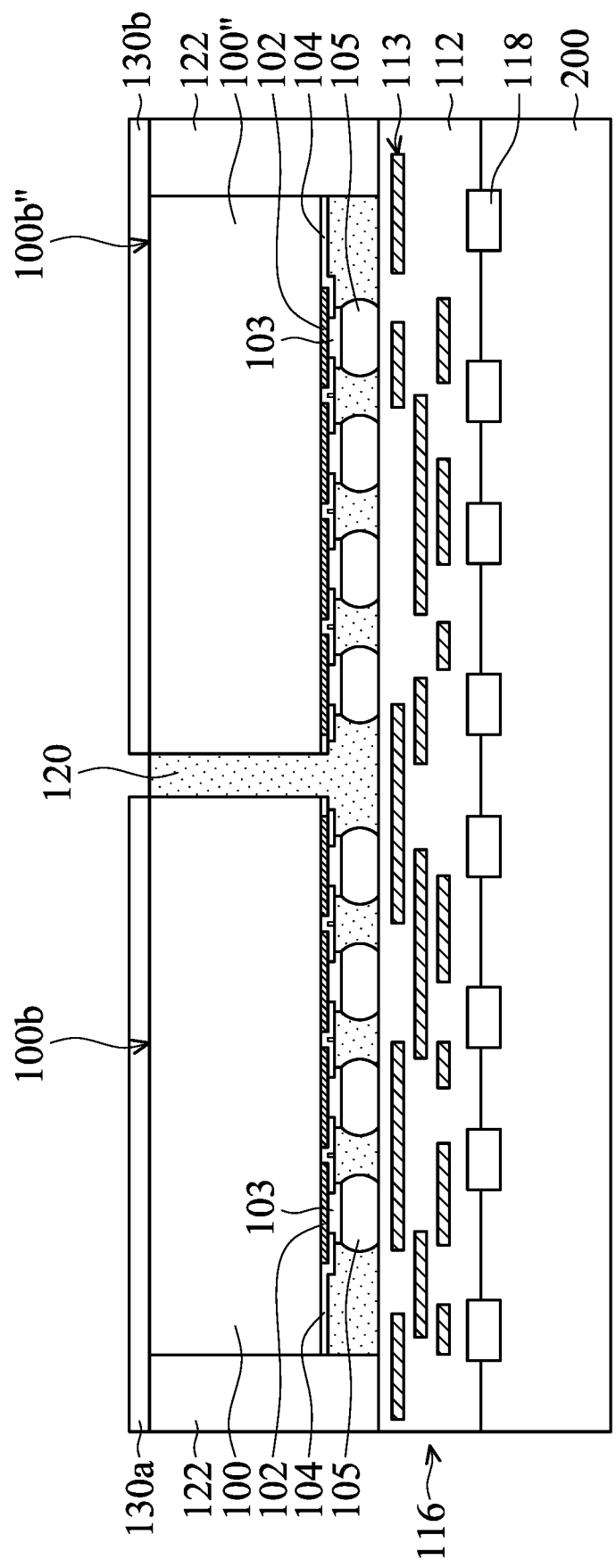
FIGS. 3A to 3E are cross-sectional views of various stages of a method for forming a chip package structure, in accordance with some embodiments.

A structure similar to the structure shown in FIG. 1F is provided, as shown in FIG. 3A in accordance with some embodiments. Unlike the structure shown in FIG. 1F, such a structure includes two heterogeneous semiconductor dies 100 and 100" that are arranged in a side by side manner, in accordance with some embodiments. For example, the semiconductor die 100 is a logic die (e.g., a CPU die, a GPU die, a MCU die, an AP die), or a SoC die. The semiconductor die 100" is a memory die or a different type die than the semiconductor die 100, having a CTE less than that of the semiconductor die 100. The rear/non-active surface 100b of the semiconductor die 100 and the rear/non-active surface 100b" of the semiconductor die 100" are in direct contact with an organic material layer 130a and an organic material layer 130b, respectively.

Figure 3B:
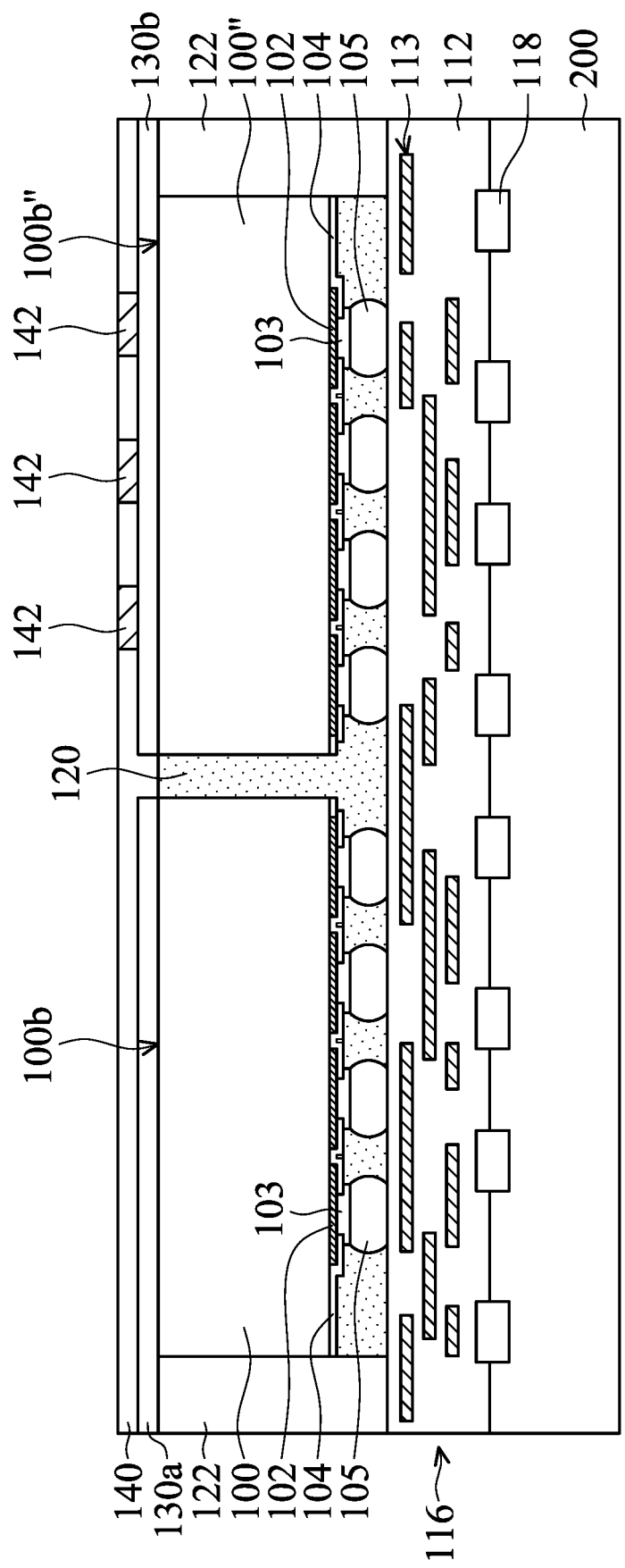

Afterwards, posts 142 with a CTE that is substantially equal to or greater than 9 ppm/° C. are formed over the organic material layer 130b, as shown in FIG. 3B in accordance with some embodiments. For example, the post 142 is made of a metal material (such as copper (Cu), gold (Au), aluminum (Al), cobalt (Co), tungsten (W) or an alloy thereof). In this case, the formation of the posts 142 includes forming a patterned resist layer 140 (such as a dry film) over the organic material layers 130a and 130b and the second material layer 120 by a lithography process. The patterned resist layer 140 has openings to expose portions of the organic material layer 130b where the posts 142 will be formed thereon. Afterwards, a plating process is performed to form a metal material layer in each of the openings of patterned resist layer 140. Afterwards, the patterned resist layer 140 is removed from the structure shown in FIG. 3B to leave posts 142 over the organic material layer 130b, as shown in FIG. 3C in accordance with some embodiments.

Figure 3C:
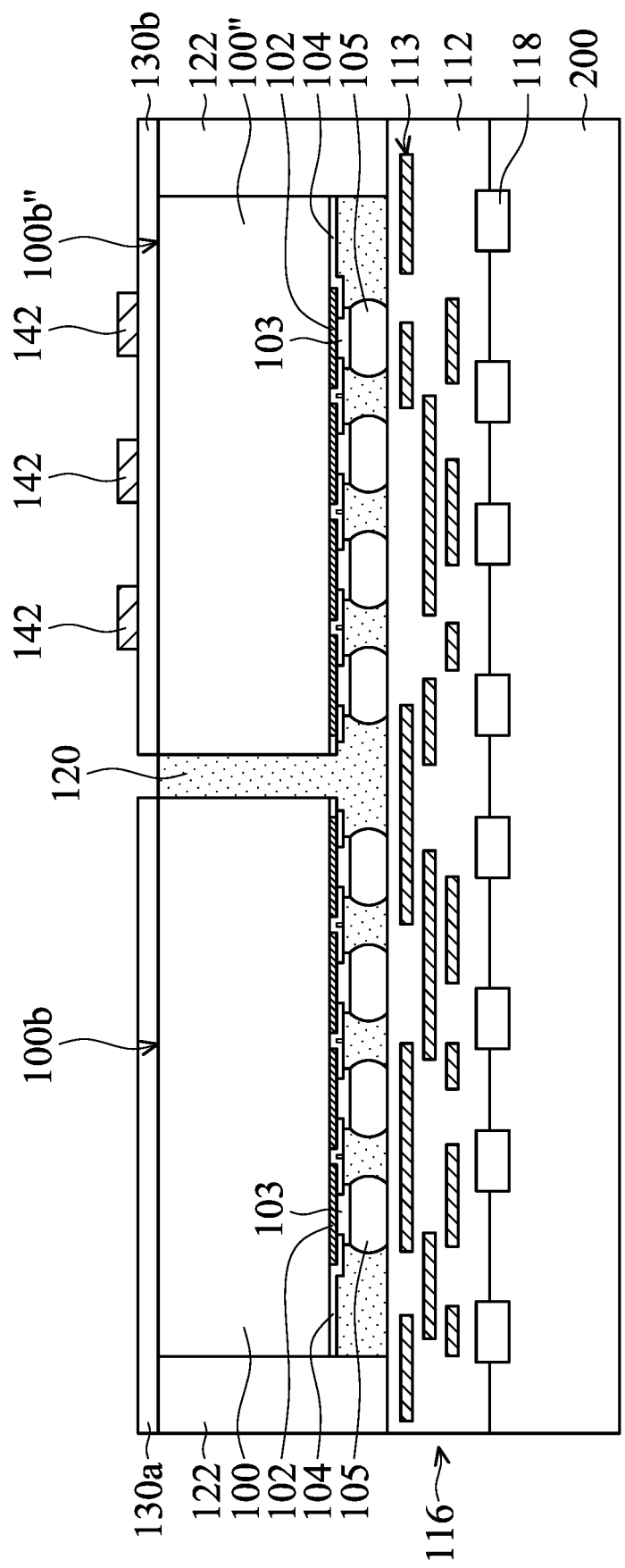
Figure 3D:
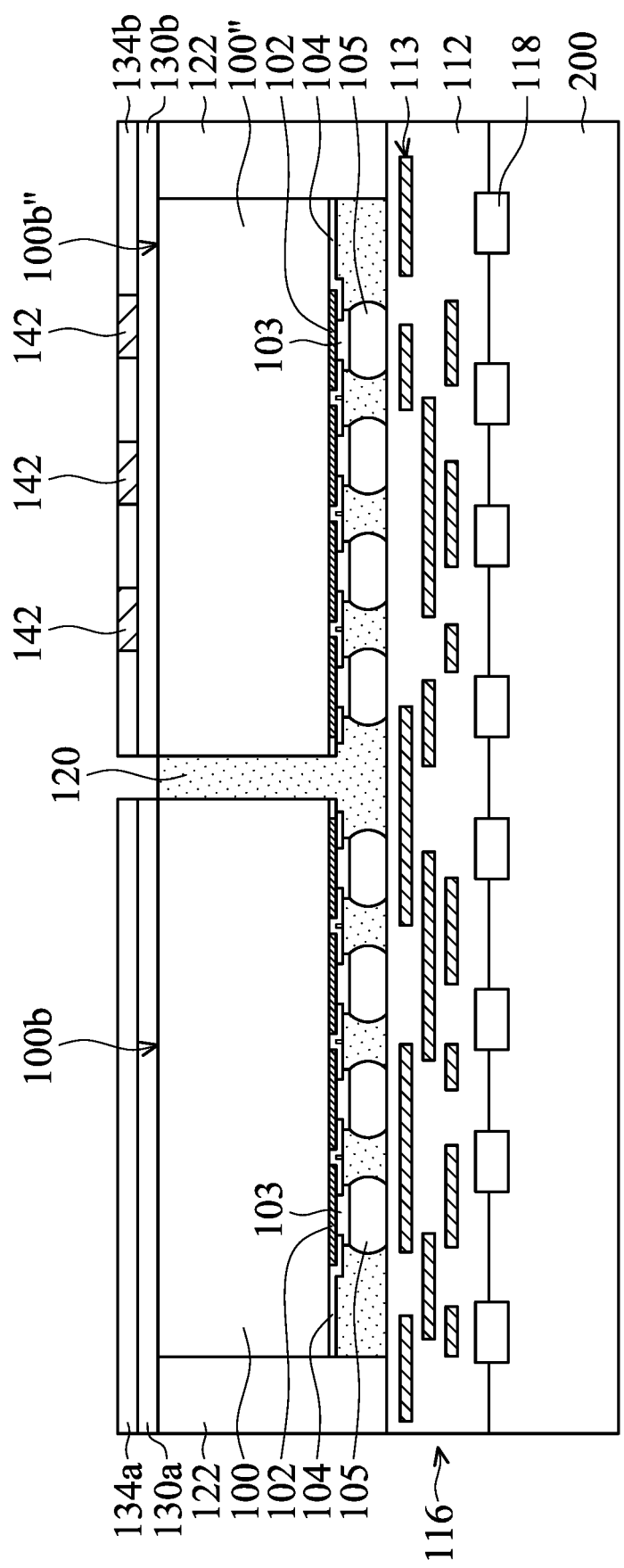

After the formation of the posts 142, an organic material (not shown) is formed to cover the structure shown in FIG. 3C. As a result, the organic material is in direct contact with the upper surfaces of the organic material layer 130a, the organic material layer 130b, the posts 142, and the second material layer 120. Afterwards, the organic material is patterned to form an organic material layer 134a corresponding to the organic material layer 130a, and an organic material layer 134b corresponding to the organic material layer 130b, as shown in FIG. 3D in accordance with some embodiments. The formed organic material layer 134b surrounds the posts 142 and exposes the upper surface of each post 142.

In some embodiments, the stack of the organic material layers 130a and 134a and the stack of the organic material layers 130b and 134b have a total thickness that is in a range from about 5 μm to about 10 μm. The organic material used for the formation of the organic material layers 134a and 134b is made of or includes a material that is the same as or different than that of the organic material used for the formation of the organic material layers 130a and 130b. For example, the organic material may be made of or include polyimide (PI), formed by a suitable deposition process (e.g., a spin-coating, CVD or PECVD process), and patterned by a lithography process. Therefore, the organic material layers 134a and 134b are also referred to as polyimide layers.

Figure 3E:
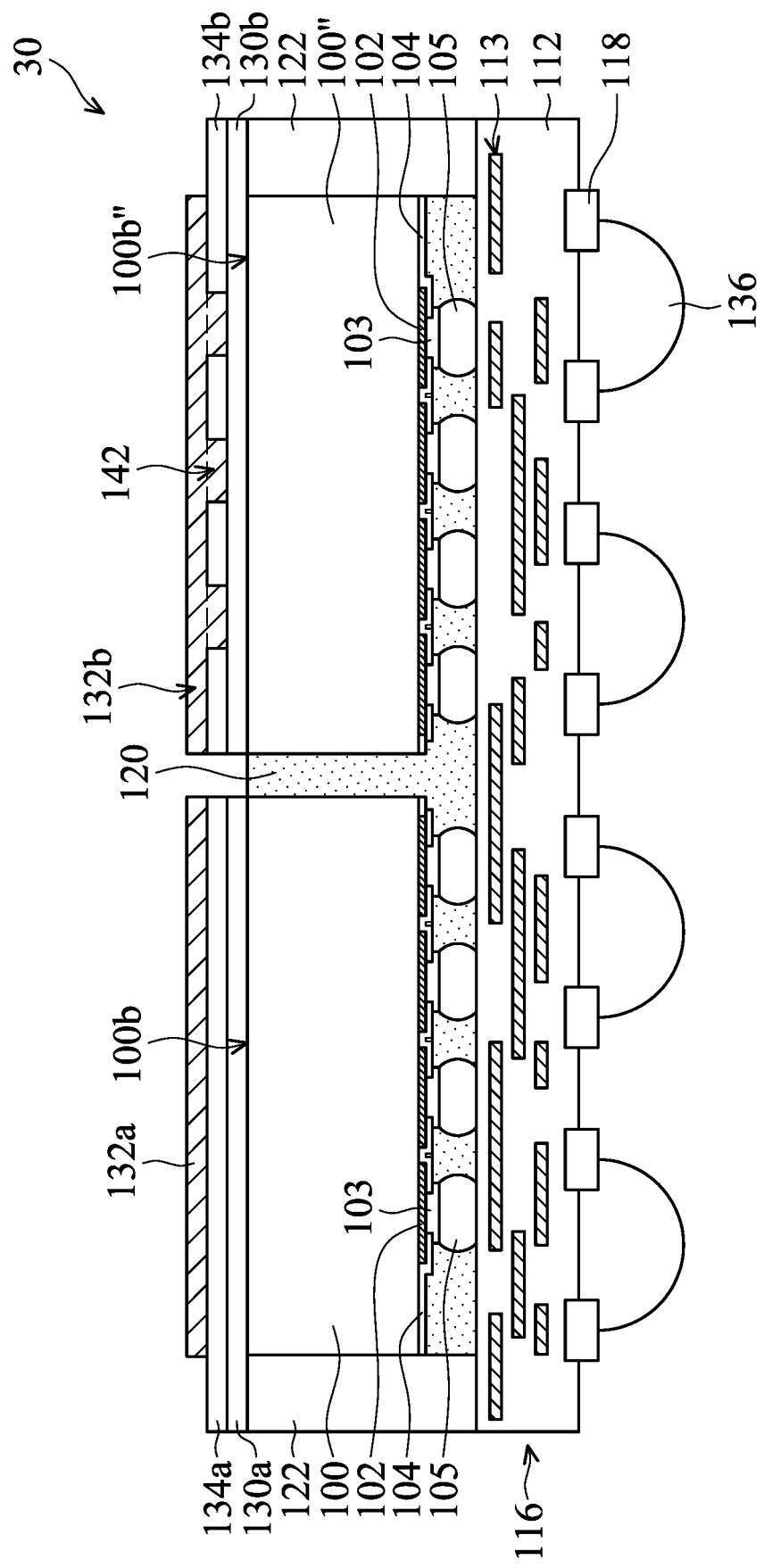
Figures 1, 3E:
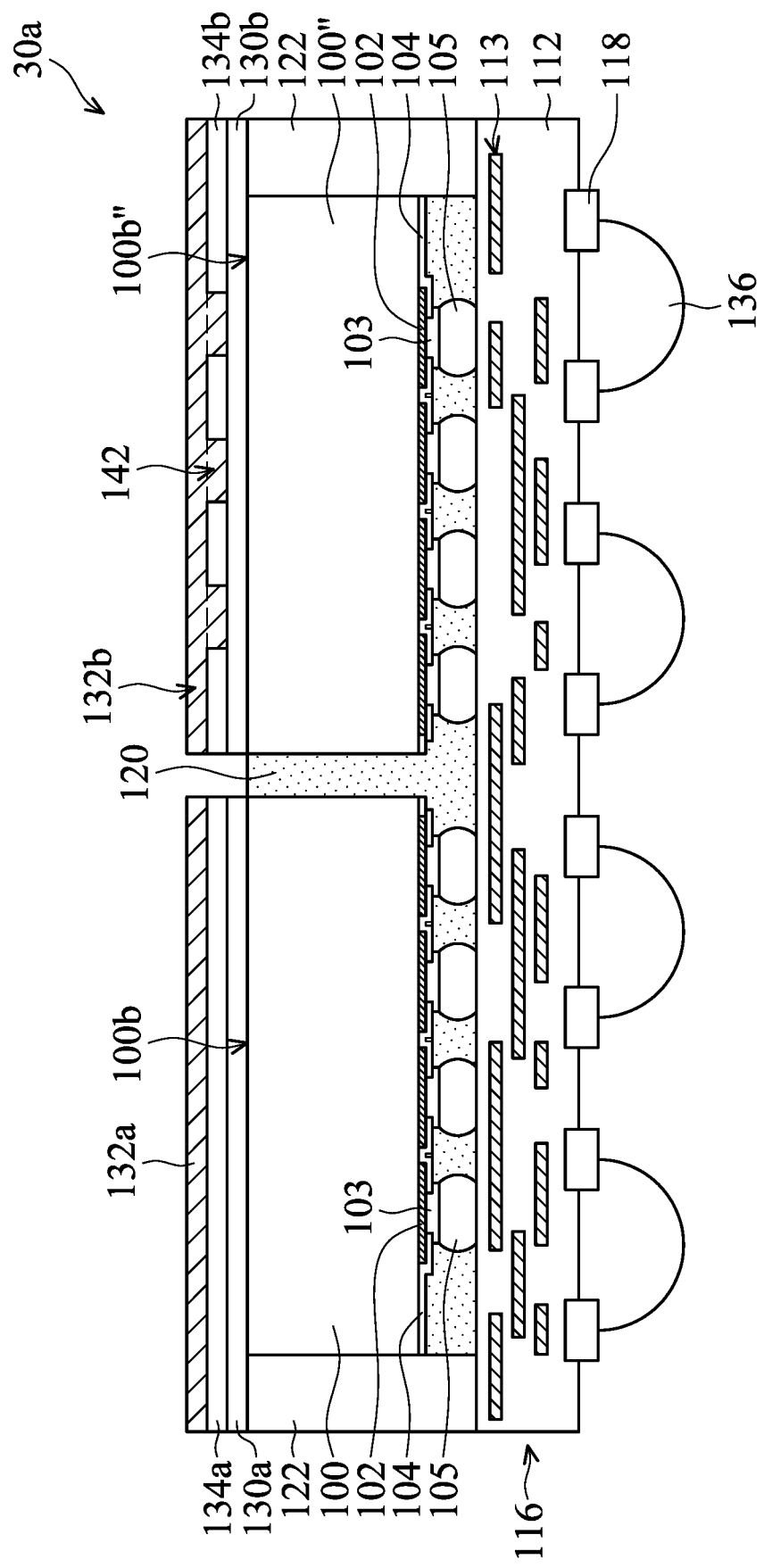
Figures 2, 3E:
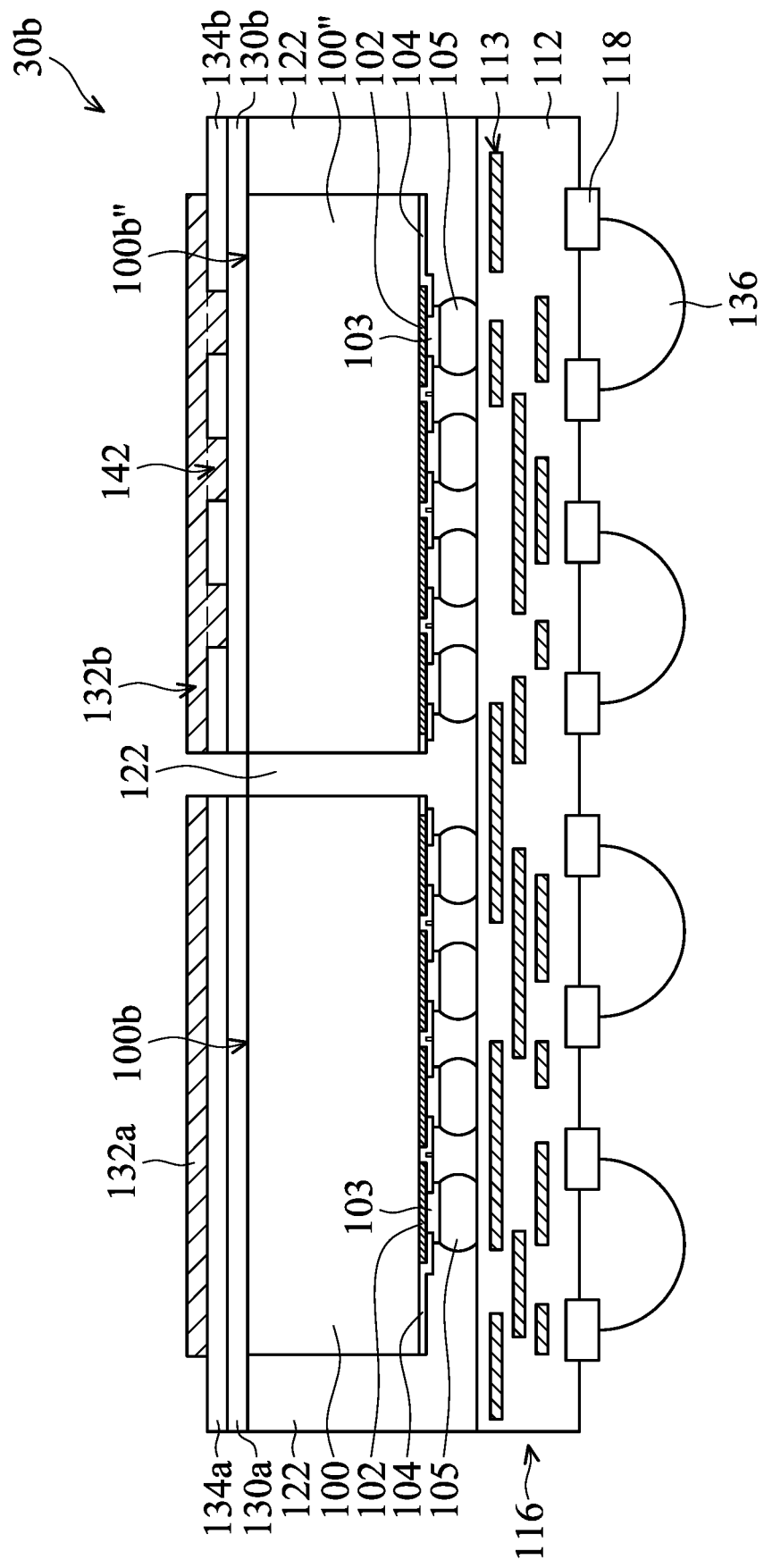

After the formation of the organic material layers 134a and 134b, high CTE material layers 132a and 132b are formed over the organic material layers 134a and 134b, respectively, as shown in FIG. 3E in accordance with some embodiments. In some embodiments, the high CTE material layers 132a and 132b are separated from each other and respectively correspond to the semiconductor dies 100 and 100". As a result, the high CTE material layers 132a and 132b cover the upper surfaces of the semiconductor dies 100 and 100", respectively. Moreover, the posts 142 are covered by and in direct contact with the high CTE material layer 132b. In some embodiments, the high CTE material layers 132a and 132b are made of or include the same material as that of the posts 142.

In some embodiments, the high CTE material layer 132a has a planar shape that is the same as a planar shape of the semiconductor die 100, so that the edges of the high CTE material layer 132a are substantially aligned to the corresponding edges of the semiconductor die 100. Similarly, the high CTE material layer 132b has a planar shape that is the same as a planar shape of the semiconductor die 100", so that the edges of the high CTE material layer 132b are substantially aligned to the corresponding edges of the semiconductor die 100".

Figure 7:
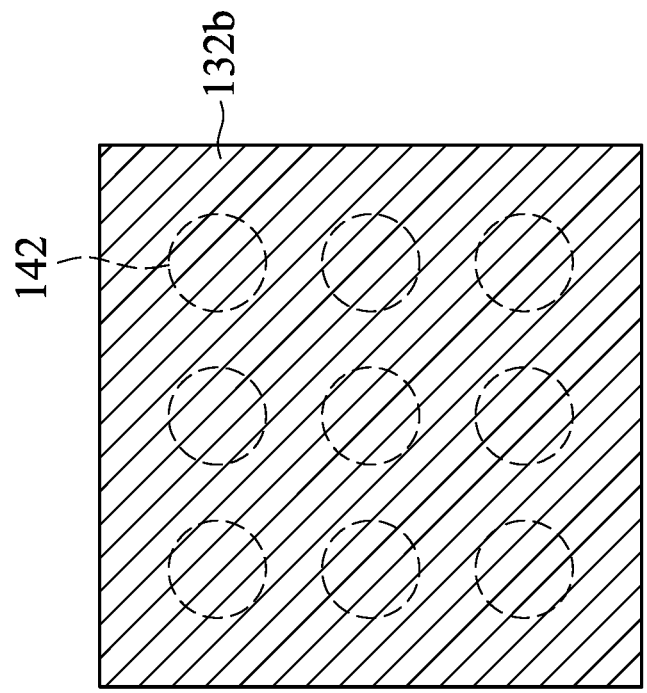
FIG. 7 is a plan view of a portion of warpage release layer structure shown in FIG. 3E, in accordance with some embodiments.
Figure 6:
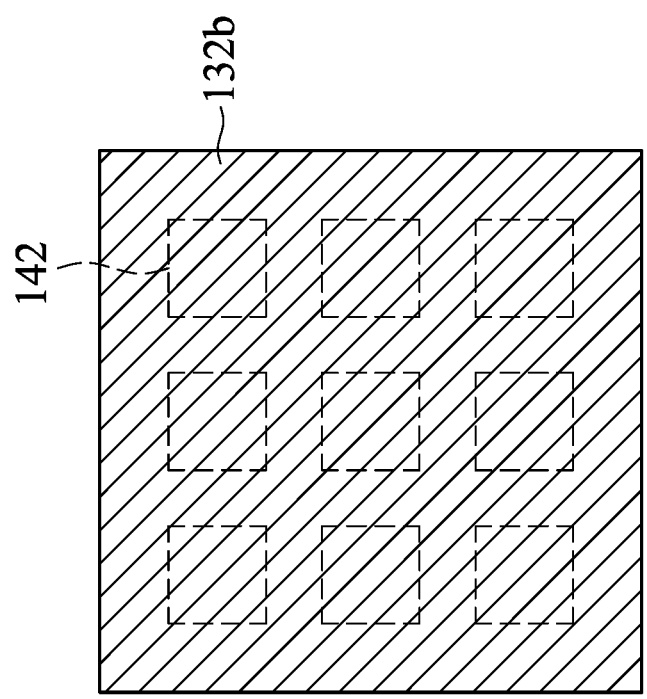
FIG. 6 is a plan view of a portion of warpage release layer structure shown in FIG. 3E, in accordance with some embodiments.

Unlike the high CTE material layer 132b shown in FIG. 1H or FIG. 2E, the formed high CTE material layer 132b having posts 142 extending from the bottom surface thereof, as shown in FIG. 3E. FIG. 6 illustrates a plan view of a portion of warpage release layer structure (e.g., the high CTE material layer 132b) shown in FIG. 3E, in accordance with some embodiments. It should be noted that the shape, size, and arrangement of the posts are based on design demands and are not limited to the exemplary embodiment shown in FIG. 6. For example, although the posts 142 shown in FIG. 6 are square-shaped, those posts 142 can be circle-shaped, as shown in FIG. 7 in accordance with some embodiments. In some other embodiments, those posts 142 have triangular shape, rectangular shape, hexagonal shape, or another suitable shape.

The posts 142 can be used for increasing the contact area between the high CTE material layer 132b and the underlying organic material structure including the organic material layers 130b. As a result, the CTE of the high CTE material layer 132b with posts 142 is greater than the CTE of the high CTE material layer 132a without posts.

Since the CTE of the semiconductor die 100" is less than that of the semiconductor die 100 and the CTE of the high CTE material layer 132b with posts 142 is greater than the CTE of the high CTE material layer 132a, the CTE mismatch between the semiconductor die 100" and the semiconductor die 100 during the subsequent the flux-dipping process and FCB process can be mitigated or prevented by the warpage release layer structure with posts.

After the formation of the warpage release layer structure with posts 142, the carrier substrate 200 is removed and electrical connectors 136 are formed in the passivation layer 118 of the interposer substrate 116 to form a chip package structure 30, as shown in FIG. 3E in accordance with some embodiments.

It should be noted that although there are two heterogeneous semiconductor dies 100 and 100" formed in the chip package structure 30, the number of the heterogeneous semiconductor dies is based on design demands and is not limited to the embodiments shown in FIG. 3E. In some embodiments, more than two heterogeneous semiconductor dies are arranged in the chip package structure 30, and each of the semiconductor dies is covered by a respective high CTE material layer.

After the chip package structure 30 is formed, a flux-dipping process is performed on the electrical connectors 136 at a room temperature in accordance with some embodiments, so as to form flux layers covering respective electrical connectors 136. Afterwards, an FCB process is performed on the electrical connectors 136 at high temperature, so as to bond the chip package structure 30 to a package substrate (not shown) that is used for connecting an external circuit (not shown).

The warpage release layer structure with the posts 142 not only mitigates the CTE mismatch between the semiconductor dies 100 and 100", but also mitigates the CTE mismatch between the semiconductor dies 100 and 100" and the interposer substrate 116 during the subsequent flux-dipping and FCB processes. As a result, the warpage of the chip package structure 30 can be effectively controlled or reduced.

Many variations and/or modifications can be made to embodiments of the disclosure. For example, in the chip package structure 30 shown in FIG. 3E, the edges of the high CTE material layer 132a are substantially aligned to the corresponding edges of the semiconductor die 100, and the edges of the high CTE material layer 132b are substantially aligned to the corresponding edges of the semiconductor die 100". However, embodiments of the disclosure are not limited thereto. FIG. 3E-1 shows a cross-sectional view of a chip package structure 30a, in accordance with some embodiments. The chip package structure 30a shown in FIG. 3E-1 is similar to the chip package structure 30 shown in FIG. 3E. In some embodiments, the materials, formation methods, and/or benefits of the chip package structure 30 shown in FIGS. 3A to 3E can also be applied in the embodiments illustrated in FIG. 3E-1, and are therefore not repeated. Unlike the chip package structure 30 shown in FIG. 3E, the edges of the high CTE material layers 132a and 132b in the chip package structure 30a shown in FIG. 3E-1 are not aligned to the corresponding edges of the semiconductor dies 100 and 100", respectively. More specifically, the edges of the high CTE material layer 132a are substantially aligned to the corresponding edges of the organic material layer 130a and the organic material layer 134a. Also, the edges of the high CTE material layer 132b are substantially aligned to the corresponding edges of the organic material layer 130b and the organic material layer 134b.

Many variations and/or modifications can be made to embodiments of the disclosure. For example, the chip package structure 30 shown in FIG. 3E employs an encapsulating layer including the underfill material layer, but embodiments of the disclosure are not limited thereto. FIG. 3E-2 shows a cross-sectional view of a chip package structure 30b, in accordance with some embodiments. The chip package structure 30b shown in FIG. 3E-2 is similar to the chip package structure 30 shown in FIG. 3E. In some embodiments, the materials, formation methods, and/or benefits of the chip package structure 30 shown in FIGS. 3A to 3E can also be applied in the embodiments illustrated in FIG. 3E-2, and are therefore not repeated. Unlike the chip package structure 30 shown in FIG. 3E, the encapsulating layer in the chip package structure 30b shown in FIG. 3E-2 includes a homogeneous or single material. More specifically, the first material layer 122 is made of a molding compound that is the same as that of the second material layer 120.

Embodiments of the disclosure provide structures and formation methods of chip package structures. The chip package structure includes a semiconductor die bonded over an interposer substrate. A warpage release layer structure is formed over the interposer substrate and includes at least one organic material layer in direct contact with the upper surface of the semiconductor die and a high coefficient of thermal expansion (CTE) material layer formed over the organic material layer. The high CTE material layer has a CTE that is substantially equal to or greater than 9 ppm/° C. The formed stress in the package at high temperature and the formed stress in the package at room temperature due to the CTE mismatch between the semiconductor die and the interposer substrate are mitigated by the use of the high CTE material layer formed over the semiconductor die, and therefore the package warpage can be reduced.

In accordance with some embodiments, a chip package structure is provided. The chip package structure includes a first semiconductor die bonded over an interposer substrate and a warpage release layer structure. The chip package structure also includes a first organic material layer covering an upper surface of the first semiconductor die; and a first metal layer covering an upper surface of the first organic material layer. The first metal layer has a planar shape that is the same as a planar shape of the first semiconductor die, as viewed in a top-view perspective.

In accordance with some embodiments, a chip package structure is provided. The chip package structure includes a molding compound layer formed over an interposer substrate and a first semiconductor die bonded over the interposer substrate. A sidewall surface of the first semiconductor die is covered a first portion of the molding compound layer. The chip package structure also includes a warpage release layer structure. The warpage release layer structure includes a first polyimide layer covering an upper surface of the first semiconductor die and an upper surface of the first portion of molding compound layer, a second polyimide layer covering an upper surface of the first polyimide layer, metal posts formed in the second polyimide layer, and a first metal layer covering an upper surface of the second polyimide layer and an upper surface of the metal posts.

In accordance with some embodiments, a method for forming a chip package structure is provided. The method includes mounting a first semiconductor die and a second semiconductor die adjacent to the first semiconductor die over an interposer substrate. The method also includes forming a first organic material layer over the first and second semiconductor dies. The method further includes forming an array of metal posts with a coefficient of thermal expansion (CTE) that is substantially equal to or greater than 9 ppm/° C. over the first organic material layer corresponding to the second semiconductor die. In addition, the method includes forming a second organic material layer over the first organic material layer and surrounding the array of metal posts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
   a first semiconductor die bonded over an interposer substrate; and
   a warpage release layer structure, comprising:
   a first organic material layer covering an upper surface of the first semiconductor die; and
   a first metal layer covering an upper surface of the first organic material layer, wherein the first metal layer has a planar shape that is the same as a planar shape of the first semiconductor die, as viewed in a top-view perspective.

2. The chip package structure as claimed in claim 1, further comprising:
   a second semiconductor die bonded over the interposer substrate,
   wherein a coefficient of thermal expansion (CTE) of the second semiconductor die is different than a CTE of the first semiconductor die, and
   wherein the warpage release layer structure further comprises:
   a second organic material layer covering an upper surface of the second semiconductor die; and
   a second metal layer covering an upper surface of the second organic material layer.

3. The chip package structure as claimed in claim 2, wherein the first semiconductor die is a logic die and the second semiconductor die is a memory die.

4. The chip package structure as claimed in claim 2, wherein the first semiconductor die is a logic die and the second semiconductor die is a memory die.

5. The chip package structure as claimed in claim 2, wherein the first metal layer and the second metal layer have a CTE that is substantially equal to or greater than 9 ppm/° C.

6. The chip package structure as claimed in claim 2, wherein the first metal layer and the second metal layer are made of copper.

7. The chip package structure as claimed in claim 2, wherein the second organic material layer has a plurality of first openings and the second metal layer has a plurality of second openings, and wherein the plurality of first openings and the plurality of second openings form through holes in the warpage release layer structure.

8. The chip package structure as claimed in claim 7, wherein a size and a shape of the plurality of first openings are the same as of a size and a shape of the plurality of second openings.

9. The chip package structure as claimed in claim 7, wherein the plurality of first openings is arranged in an array.

10. A chip package structure, comprising:
    a molding compound layer formed over an interposer substrate;
    a first semiconductor die bonded over the interposer substrate, wherein a sidewall surface of the first semiconductor die is covered by a first portion of the molding compound layer; and
    a warpage release layer structure, comprising:
    a first polyimide layer covering an upper surface of the first semiconductor die and an upper surface of the first portion of molding compound layer;
    a second polyimide layer covering an upper surface of the first polyimide layer;
    a plurality of metal posts formed in the second polyimide layer; and
    a first metal layer covering an upper surface of the second polyimide layer and an upper surface of the plurality of metal posts.

11. The chip package structure as claimed in claim 10, further comprising:
    a second semiconductor die bonded over the interposer substrate, wherein a sidewall surface of the second semiconductor die is covered a second portion of the molding compound layer,
    wherein a coefficient of thermal expansion (CTE) of the second semiconductor die is different than a CTE of the first semiconductor die.

12. The chip package structure as claimed in claim 11, wherein the warpage release layer structure further comprises:
    a third polyimide layer covering an upper surface of the second semiconductor die and an upper surface of the second portion of the molding compound layer;
    a fourth polyimide layer covering an upper surface of the third polyimide layer; and
    a second metal layer covering an upper surface of the fourth polyimide layer, wherein the second metal layer is separated from the third polyimide layer by the fourth polyimide layer.

13. The chip package structure as claimed in claim 12, wherein the first portion of the molding compound layer has a sidewall surface substantially aligned with sidewall surfaces of the first polyimide layer and the second polyimide layer, and the second portion of the molding compound layer has a sidewall surface substantially aligned with sidewall surfaces of the third polyimide layer and the fourth polyimide layer.

14. The chip package structure as claimed in claim 10, wherein the plurality of metal posts is arranged in array.

15. The chip package structure as claimed in claim 14, wherein the plurality of metal posts is made of a material that is the same as a material of the first metal layer.

16. A chip package structure, comprising:
    an encapsulating layer formed over an interposer substrate;

a first semiconductor die and a second semiconductor die formed in the encapsulating layer and bonded over the interposer substrate; and
a warpage release layer structure, comprising:
a first organic material layer covering an upper surface of the first semiconductor die and an upper surface of the second semiconductor die and exposing an upper surface of the encapsulating layer between the first semiconductor die and the second semiconductor die; and
a metal layer covering an upper surface of the first organic material layer and exposing the upper surface of the encapsulating layer between the first semiconductor die and the second semiconductor die.

17. The chip package structure as claimed in claim 16, further comprising:
a second organic material layer between the metal layer and the first organic material layer and exposing the upper surface of the encapsulating layer between the first semiconductor die and the second semiconductor die; and
a plurality of metal posts formed in a portion of the second organic material layer corresponding to a portion of the first organic material layer that covers the upper surface of the first semiconductor die.

18. The chip package structure as claimed in claim 17, wherein a coefficient of thermal expansion (CTE) of the first semiconductor die is less than a CTE of the second semiconductor die.

19. The chip package structure as claimed in claim 17, wherein the plurality of metal posts is made of a material that is the same as a material of the metal layer.

20. The chip package structure as claimed in claim 16, wherein the encapsulating layer comprising:
an underfill material portion formed between the first semiconductor die and the second semiconductor die and between the interposer substrate and the first and second semiconductor dies; and
a molding compound material layer surrounding the first and second semiconductor dies.

* * * * *